United States Patent
Fujita et al.

(10) Patent No.: US 8,704,441 B2
(45) Date of Patent: Apr. 22, 2014

(54) SURFACE LIGHT SOURCE DEVICE

(75) Inventors: Megumi Fujita, Tokyo (JP); Hiroyasu Inoue, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 13/702,124

(22) PCT Filed: Jun. 23, 2011

(86) PCT No.: PCT/JP2011/064476
§ 371 (c)(1),
(2), (4) Date: Dec. 5, 2012

(87) PCT Pub. No.: WO2012/002260
PCT Pub. Date: Jan. 5, 2012

(65) Prior Publication Data
US 2013/0076238 A1     Mar. 28, 2013

(30) Foreign Application Priority Data
Jun. 29, 2010   (JP) ................. 2010-147788

(51) Int. Cl.
*H01L 51/54*     (2006.01)

(52) U.S. Cl.
USPC .......................... 313/504; 313/110

(58) Field of Classification Search
USPC ................. 313/498–512, 110, 116
See application file for complete search history.

(56) References Cited

U.S. PATENT DOCUMENTS

| 8,395,305 B2 * | 3/2013 | Fujimoto et al. ...... 313/110 |
| 2005/0059766 A1 * | 3/2005 | Jones et al. ...... 524/431 |
| 2009/0179543 A1 * | 7/2009 | Fujimoto et al. ...... 313/110 |
| 2012/0068596 A1 | 3/2012 | Inoue et al. |
| 2012/0132897 A1 | 5/2012 | Seki et al. |

FOREIGN PATENT DOCUMENTS

| JP | 2002-237381 A | 8/2002 |
| JP | 2003-59641 A | 2/2003 |
| JP | 2009-110873 A | 5/2009 |
| JP | 2010-27428 A | 2/2010 |
| JP | 2010-97711 A | 4/2010 |
| JP | 4711027 B2 | 6/2011 |
| JP | 2011-165444 A | 8/2011 |
| JP | 4740403 B2 | 8/2011 |

OTHER PUBLICATIONS

International Search Report issued in PCT/JP2011/064476 mailed Sep. 27, 2011.

* cited by examiner

*Primary Examiner* — Donald Raleigh
(74) *Attorney, Agent, or Firm* — Birch, Stewart, Kolasch & Birch, LLP

(57) ABSTRACT

A surface light source device including: an organic EL element having a light-emitting surface for emitting light; and a light output surface structure layer provided on the organic EL element on a side of the light-emitting surface, wherein the light output surface structure layer includes concave portions which are relatively recessed and convex portions which are relatively projected, the concave portions and convex portions being provided on a surface opposite to the organic electroluminescent element in an alternate manner along an in-plane direction parallel to the surface, and the bottom of the concave portion and the top of the convex portion that are adjacent to each other are distant with distances in a thickness direction of the surface light source device, the distances being made uneven with a standard deviation range of not less than 0.05 μm.

5 Claims, 11 Drawing Sheets

SURFACE LIGHT SOURCE DEVICE

FIELD

The present invention relates to a surface light source device. More particularly, the invention relates to a surface light source device which includes an organic electroluminescent element (hereinafter referred to as the "organic EL element" when appropriate).

BACKGROUND

A surface light source device with an organic EL element can have a planar shape and provide light of white color or a color close thereto. Accordingly, the surface light source device with an organic EL element is thought to be employed, for example, as a light source of a lighting apparatus for lighting space in living environments or as a backlight unit used for display devices.

However, the currently known organic EL element is too low in efficiency to be employed for the aforementioned lighting use. Therefore, it is desired to improve the light extraction efficiency of the organic EL element. As a method for improving light extraction efficiency of the organic EL element, there is known a method wherein a variety of concavo-convex structures are formed on a side that is closer to a light output surface than the organic EL element. For example, there are proposals such as providing a prism containing a fluorescent compound (Patent Literature 1) and providing a microlens array (Patent Literature 2) on the light output surface. These concavo-convex structures can achieve favorable collection of light, to thereby improve light extraction efficiency.

CITATION LIST

Patent Literature

Patent Literature 1: Japanese Patent Application Laid-Open No. 2002-237381 A
Patent Literature 2: Japanese Patent Application Laid-Open No. 2003-59641 A

SUMMARY

Technical Problem

However, when conventional concavo-convex structures are formed on the light output surface, interference of reflected light may occur due to the reflection of light that has entered from the outside of the device and is then reflected on the light output surface. Such an interference may result in rainbow-like unevenness in color (hereinafter referred to as "rainbow unevenness") observed on the light output surface. When a surface light source device which generates such a rainbow unevenness was provided on a display device, a plurality of reflected images were observed on the display surface of the display device, i.e., an image multiplication phenomenon occurred in some cases. Such a rainbow unevenness cause considerable deterioration in quality of the surface light source device as a light source, and therefore prevention thereof is desired.

As a possible means for preventing generation of rainbow unevenness, size of the concavo-convex structure on the light output surface may be controlled with higher precision so as to prevent the interference of the reflected light. In this case, however, a mold for use in formation of the concavo-convex structure needs highly enhanced precision, which causes difficulty in mass production and elevates manufacturing cost.

The present invention was developed in view of the aforementioned problems, and an object of the present invention is to provide a surface light source device which has a high light extraction efficiency and less rainbow unevenness on a light output surface thereof and which can be manufactured easily.

Solution to Problem

As the results of intensive studies conducted for solving the aforementioned problems, the inventor of the present invention found out that the rainbow unevenness can be suppressed and the light extraction efficiency can be enhanced by purposefully forming a concavo-convex structure to have an uneven (irregular) height so that the height is varied in a predetermined range. The inventor also found out that allowing the concavo-convex structure to have an irregular height results in less strict size precision requirement for the concavo-convex structure, which facilitates mass production and reduces manufacturing cost. Based on the aforementioned findings, the inventor completed the present invention.

That is, according to the present invention, there are provided the following [1] to [5]:

(1) A surface light source device comprising: an organic electroluminescent element having a light-emitting surface for emitting light; and a light output surface structure layer provided on the organic electroluminescent element on a side of the light-emitting surface, wherein the light output surface structure layer includes concave portions which are relatively recessed and convex portions which are relatively projected, the concave portions and convex portions being provided on a surface opposite to the organic electroluminescent element in an alternate manner along an in-plane direction parallel to the surface, and the bottom of the concave portion and the top of the convex portion that are adjacent to each other are distant with distances in a thickness direction of the surface light source device, the distances being made uneven with a standard deviation range of not less than 0.05 μm.

(2) The surface light source device according to (1), wherein the surface of the light output surface structure layer opposite to the organic electroluminescent element is exposed on an outermost surface of the surface light source device.

(3) The surface light source device according to (1) or (2), wherein the concave portion or the convex portion is in a pyramidal shape or a prismoidal shape.

(4) The surface light source device according to any one of (1) to (3), wherein the top of the convex portion is a flat surface parallel to the light-emitting surface.

(5) The surface light source device according to any one of (1) to (3), wherein either one or both of the bottom of the concave portion and the top of the convex portion is/are in a round shape.

Advantageous Effects of Invention

The surface light source device of the present invention has a high light extraction efficiency and less rainbow unevenness on a light output surface thereof and can be manufactured easily.

DESCRIPTION OF EMBODIMENTS

Figure 1:
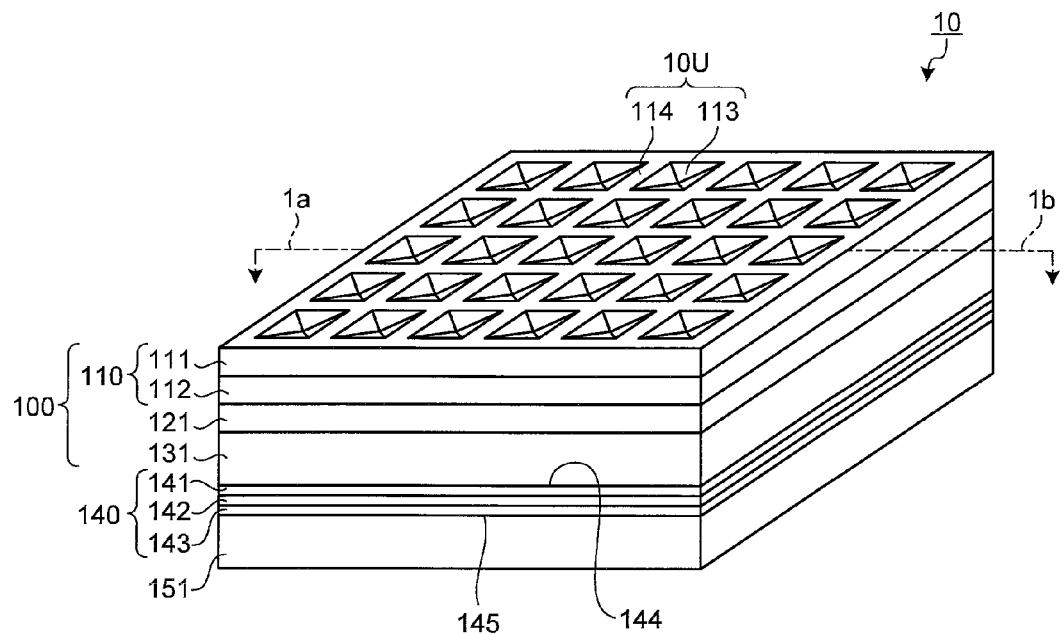
FIG. 1 is a perspective view schematically illustrating a surface light source device according to a first embodiment of the present invention.

The present invention will be described hereinbelow in more detail below with reference to the embodiments and illustrations. However, the present invention will not be limited to the following embodiments and illustrations, and may be arbitrary modified without departing from the scope of the claims and equivalents thereof. In the cross-sectional views among the drawings to be explained hereinbelow, the degree of unevenness in adjacent concavo-convex height differences H (described later) is shown with exaggeration. However, in the present invention, the degree of unevenness is not limited to the sizes illustrated in the drawings.

[1. First Embodiment]

Figure 2:
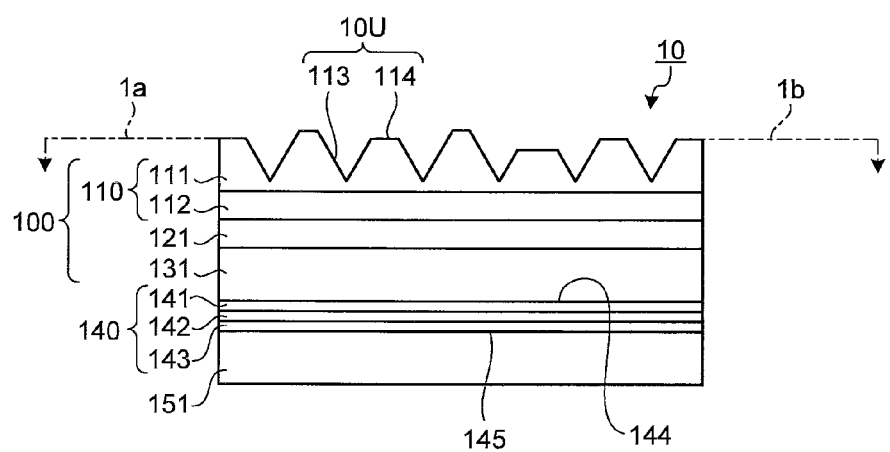
FIG. 2 is a cross-sectional view schematically illustrating the surface light source device according to the first embodiment of the present invention, the cross section thereof cutting the surface light source device shown in FIG. 1 along a plane passing through line 1a-1b and perpendicular to a light output surface.

FIGS. 1 and 2 are explanatory views illustrating a surface light source device according to a first embodiment of the present invention. FIG. 1 is a perspective view schematically illustrating the surface light source device. FIG. 2 is a schematic cross-sectional view illustrating the surface light source device of FIG. 1, wherein the device is cut by a plane passing through line 1a-1b and perpendicular to a light output surface.

As shown in FIG. 1, a surface light source device 10 according to the first embodiment of the present invention is a device having a rectangular flat-shaped structure and includes an organic EL element 140. The organic EL element 140 includes at least a first electrode layer 141, a light-emitting layer 142, and a second electrode layer 143 in this order, and is configured to be able to emit light from at least one of surfaces 144 and 145 thereof. In the present embodiment, the first electrode layer 141 is a transparent electrode and the second electrode layer 143 is a reflecting electrode. Accordingly, light from the light-emitting layer 142 passes through the first electrode layer 141, or the light is reflected at the second electrode layer 143 and then passes through the light-emitting layer 142 and the first electrode layer 141, so that the light can be emitted from the surface 144. Therefore, in the following description, the surface 144 is referred to as the "light-emitting surface".

On the light-emitting surface 144 side of the organic EL element 140, a light output surface structure layer 100 is provided. In the present embodiment, the light output surface structure layer 100 is directly provided in contact with the light-emitting surface 144.

The surface light source device 10 of this embodiment may further include a component other than the aforementioned members. In this embodiment, a sealing substrate 151 is provided on the surface 145 of the organic EL element 140. In the drawing, the surface 145 is illustrated as the lower side of the element. Although not illustrated in the drawing, between the surface 145 and the sealing substrate 151, there may exist any substance such as a filler or an adhesive, or there may exist a gap. In the gap, there may exist air or other gases so long as no disadvantage is caused, for example, unless the durability of the light-emitting layer 142 is not seriously compromised. Alternatively, the gap may be in vacuo.

Accordingly, the surface light source device 10 includes the sealing substrate 151, the organic EL element 140, and the light output surface structure layer 100 in this order, whereby the surface light source device 10 can emit light through a surface 10U of the light output surface structure layer 100, wherein the surface 10U is a surface opposite to the organic EL element 140. The surface 10U is located at the outermost position of the surface light source device 10 and light goes out of the surface light source device 10 through the surface 10U. Thus, the surface 10U may be referred to as the "light output surface".

[1-1. Organic EL Element]

As exemplified as the organic EL element 140, the organic EL element is usually made up of two or more electrode layers, and a light-emitting layer disposed between these electrode layers so as to emit light upon application of a voltage from the electrodes.

The organic EL element is usually constructed such that layers, such as the electrode and the light-emitting layer which constitute the organic EL element, are formed on a substrate, and a sealing member is provided to cover those layers, whereby the layers such as the light-emitting layer are sealed between the substrate and the sealing member. Generally, the organic EL element which emits light from the substrate side stated herein is called a bottom emission type, whereas the organic EL element which emits light from the sealing member side is called a top emission type. The organic EL element 140 provided to the surface light source device 10 may be either one of these types. In the case of the bottom emission type, the light output surface structure layer usually consists of a combination of layers including the substrate and, if necessary, an optional layer, whereas in the case of the top emission type, the light output surface structure layer usually consists of a combination of layers including a light output surface-side structure such as the sealing member and, if necessary, an optional layer.

There is no particular limitation on the light-emitting layer. The light-emitting layer may be appropriately chosen from among known ones. The light-emissive material of the light-emitting layer to be employed is not limited to one type, but may be of two or more types combined at any ratio. Furthermore, the light-emitting layer is not limited to one layer, but may be a single layer of one type or a combination of layers of a plurality of types so as to be fit for use as a light source. This allows the light-emitting layer to emit light of white color or a color close thereto.

The electrode of the organic EL element is not limited to a particular one, but may be appropriately chosen from among known ones. As in the case of the organic EL element 140 according to the first embodiment, the electrode 141 on the side of the light output surface structure layer 100 may formed as a transparent electrode and the electrode 143 on the opposite side may be formed as a reflecting electrode, so that the organic EL element can be configured to emit light from the light-emitting surface 144 toward the light output surface structure layer 100. Alternatively, both the electrodes 141 and 143 may be formed as transparent electrodes, and a reflecting member or a diffusion member (such as a white diffusion member placed via an air layer) may be provided on the opposite side of the light output surface structure layer 100, so that light emission toward the light output surface structure layer 100 can be achieved.

In addition to the light-emitting layer 142, the organic EL element 140 may also have another layer (not shown), such as a hole injection layer, a hole transport layer, an electron transport layer, and an electron injection layer between the electrode 141 and the electrode 143. Furthermore, the organic EL element 140 may also include an optional component such as wiring for applying electricity to the electrodes 141 and 143, and a peripheral structure for sealing the light-emitting layer 142.

The materials for forming the electrodes and the layer provided therebetween are not limited to a particular one, and specific examples thereof may include the following.

Examples of the material for the transparent electrode layer may include indium tin oxide (ITO).

Examples of the material for the hole injection layer may include a starburst-based aromatic diamine compound.

Examples of the material for the hole transport layer may include a triphenyl diamine derivative.

Examples of the host material for a yellow light-emitting layer may include a triphenyl diamine derivative, while examples of the dopant material for the yellow light-emitting layer may include a tetracene derivative.

Examples of the material for a green light-emitting layer may include a pyrazoline derivative.

Examples of the host material for a blue light-emitting layer may include an anthracene derivative, while examples of the dopant material for the blue light-emitting layer may include a perylene derivative.

Examples of the material for a red light-emitting layer may include a europium complex.

Examples of the material for the electron transport layer may include an aluminum quinoline complex (Alq).

Examples of the material for the reflecting electrode may include lithium fluoride and aluminum, which may be used in sequence to perform lamination by vacuum layer formation.

It is also acceptable to appropriately combine the aforementioned light-emitting layers or other light-emitting layers to obtain a light-emitting layer, referred to as a multi-layer type or tandem type, which emits light having complementary colors. The combination of complementary colors may be, for example, yellow/blue or green/blue/red.

[1-2. Light Output Surface Structure Layer]

The light output surface structure layer 100 is a layer provided on the light-emitting surface 144 of the organic EL element 140. The light output surface 10U is a surface of the light output surface structure layer 100, the surface being opposite to the organic EL element 140. The light output surface 10U is exposed on the outermost surface of the surface light source device 10 and serves as a light output surface of the surface light source device 10, i.e., the light output surface through which light exits outwardly from the surface light source device 10.

When viewed macroscopically, the light output surface 10U is parallel to the light-emitting surface 144 of the organic EL element 140 and parallel to the principal plane of the surface light source device 10. However, when viewed microscopically, the light output surface 10U has a concavo-convex structure which will be described later, and therefore the surface on the concave portion or convex portion may form a non-parallel angle relative to the light-emitting surface 144. Therefore, as used in the following descriptions, the expression "being parallel to" or "being perpendicular to" the light output surface means, unless otherwise specified, to be parallel to or to be perpendicular to the light output surface, respectively, when viewed macroscopically with the concave portion and the convex portion ignored. Furthermore, unless otherwise specified, the description will be made to the surface light source device 10, with the light output surface 10U placed to be parallel to the horizontal direction and oriented upward.

Further, the expression that a component member is "parallel" or "perpendicular" may tolerate a range of error which may not compromise the effects of the present invention, for example, within a range of ±5°.

The light output surface structure layer 100 includes: a multi-layered body 110 which includes a concavo-convex structure layer 111 and a substrate film layer 112; a supporting substrate 131 as a substrate; and an adhesive layer 121 for bonding the multi-layered body 110 and the supporting substrate 131 together.

The concavo-convex structure layer 111 is a layer positioned on the upper surface of the surface light source device 10 (i.e., the outermost layer of the surface light source device 10 on the light output surface side). The concavo-convex structure layer 111 has a concavo-convex structure including a plurality of concave portions 113 and flat portions 114 positioned around the concave portions 113. In this case, the concave portion 113 acts as the concave portion of the present invention since the concave portion 113 is recessed relatively to the flat portion 114, while the flat portion 114 acts as the convex portion of the present invention since the flat portion 114 is projected relatively to the concave portion 113. The concavo-convex structure defines the light output surface 10U.

Since the drawings in this specification are schematic illustrations, only a small number of the concave portions 116 are shown on the light output surface 10U. However, in an actual surface light source device, a far larger number of the concave portions may be provided on the light output surface of one surface light source device.

[Description of Concavo-Convex Structure Layer]

The concavo-convex structure of the light output surface 10U will be described hereinbelow in more detail with reference to the drawings.

Figure 3:
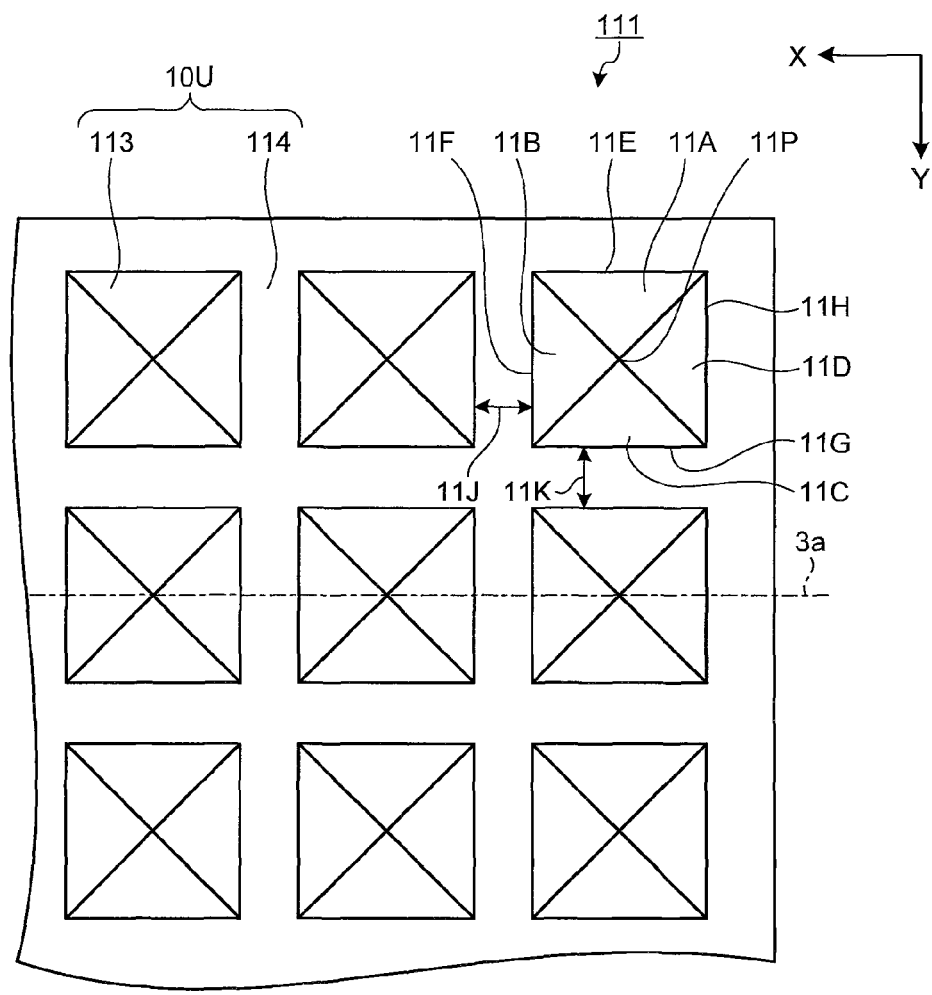
FIG. 3 is an enlarged partial plan view schematically illustrating a part of the light output surface of the surface light source device according to the first embodiment of the present invention when viewed in the thickness direction of the surface light source device.
Figure 4:
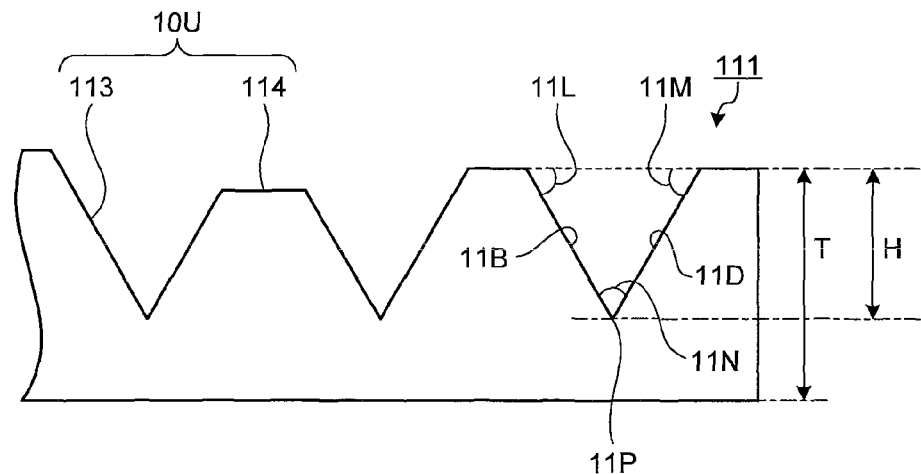
FIG. 4 is a partial cross-sectional view schematically illustrating a cross section of the concavo-convex structure layer according to the first embodiment of the present invention, the cross section being along a plane passing through line 3a shown in FIG. 3 and perpendicular to the light output surface.

FIG. 3 is an enlarged partial plan view schematically illustrating a part of the light output surface 10U of the surface light source device 10 when viewed in the thickness direction of the surface light source device 10. FIG. 4 is a partial cross-sectional view schematically illustrating a cross section of the concavo-convex structure layer 111, wherein the cross section is along a plane passing through line 3a of FIG. 3 and perpendicular to the light output surface 10U. Unless otherwise specified, "the thickness direction" in the following description refers to the thickness direction of the surface light source device.

As shown in FIG. 3, the light output surface structure layer 100 includes, on the light output surface 10U, a plurality of the concave portions 113 including inclined surfaces 11A to 11D, and the flat portions 114 positioned around the concave portions 113. The term "inclined surface" herein refers to a plane which forms a non-parallel angle with the light output surface 10U. Contrary to this, the surface on the flat portion 114 is a flat plane parallel to the light output surface 10U.

Each of the concave portions 113 is a regular quadrangular pyramid-shaped recess. Therefore, the inclined surfaces 11A to 11D of the concave portion 113 have an identical shape, and base edges 11E to 11H of the regular quadrangular pyramid forms a quadrate. The line 3a in FIG. 3 is a line which passes through all apexes 11P of the concave portions 113 in one line and is a line parallel to the base edges 11E and 11G of the concave portion 113.

The length of the base edges 11F to 11H of each of the concave portions 113 may usually be 1 to 60 μm and preferably 2 to 50 μm. The depth of each concave portion 113 may usually be 1 to 50 μm, and preferably 2 to 40 μm.

The concave portions 113 are consecutively arranged at regular intervals along two perpendicular in-plane directions X and Y. In the in-plane directions X and Y, a portion that is a gap between adjacent concave portions 113 constitutes the flat portion 114. Consequently, the light output surface structure layer 100 is configured to have the concave portions 113 and the flat portions 114 in an alternate manner in the in-plane directions X and Y which are parallel to the light output surface 10U. In this instance, among these two in-plane directions X and Y, one in-plane direction X is parallel to the base edges 11E and 11G. In the in-plane direction X, a plurality of the concave portions 113 are aligned at regular intervals 11J. Among these two in-plane directions X and Y, the other in-plane direction Y is parallel to the base edges 11F and 11H. In the in-plane direction Y, a plurality of the concave portions 113 are aligned at regular intervals 11K. The flat portion 114 which is a portion corresponding to the gap may usually have a width size of 0.1 to 20 μm.

As shown in FIG. 4, angles 11L and 11M formed between each of the inclined surfaces 11A to 11D, which constitute the concave portion 113, and the flat portion 114 (and by extension, the light output surface 10U) are preferably not less than 40°, and more preferably not less than 45°, whereas preferably not more than 70°, and more preferably not more than 60°. When the concave portion 113 has a quadrangular pyramid shape as in the present embodiment, the apex angle 11N thereof is preferably 60 to 90°. Furthermore, from the perspective of enhancing the light extraction efficiency while minimizing changes in color tone depending on viewing angles, the angles 11L and 11M formed between each of the inclined surfaces 11A to 11D and the flat portion 114 is preferably larger. More specifically, the angles 11L and 11M are preferably not less than 55°, and more preferably not less than 60°. In this case, the upper limit of these angles 11L and 11M is usually 70° in consideration of maintaining the durability of the concavo-convex structure layer 111.

In the present embodiment, as show in FIG. 4, the angles 11L and 11M between the inclined surfaces 11A to 11D and the flat portion 114 are set at 60°. Accordingly, an apex angle of the regular quadrangular pyramid constituting the concave portion 113, i.e., an angle at the apex 11P between the inclined surfaces which face each other (an angle 11N shown in FIG. 4 as to the angle formed between the inclined surfaces 11B and 11D) is also 60°.

Furthermore, on the light output surface 10U of the surface light source device 10 in the present embodiment, the bottoms of the concave portion 113 and the top of the convex portion that are adjacent to each other are distant with distances in the thickness direction of the surface light source device 10, the distances being made uneven within a predetermined range.

In this instance, the bottom of the concave portion 113 refers to a portion which is the most recessed in each of the concave portions 113 and which has the shortest distance to the light-emitting surface 144 in the thickness direction of the surface light source device 10. In the present embodiment, the apex 11P of each of the concave portions 113 is the bottom of the concave portion 113.

The top of the convex portion refers to a portion which is the most projected in each of the convex portions and which has the longest distance to the light-emitting surface 144 in the thickness direction of the surface light source device 10. Since the flat portion 114 serves as a flat surface parallel to the light-emitting surface 144 in the present embodiment, the flat portion 114 itself acts as the top of the convex portion.

Therefore, in the surface light source device 10 of the present embodiment, when the concave portions 113 and the flat portions 114 which are adjacent to each other on the light output surface 10U are compared, distances H between adjacent tip and bottom are made uneven within a predetermined range, wherein the distance H is a distance in the thickness direction of the surface light source device 10 between each bottom of the concave portions 113 (i.e., the apexes 11P of the concave portions 113) and each top of the convex portions (i.e., the flat portions 114) which are adjacent to each other (when appropriate, the distance is hereinafter referred to as the "adjacent concavo-convex height difference"). In this case, the predetermined range refers to a standard deviation (sample standard deviation) σ in the range of usually not less than 0.05 μm, preferably not less than 0.06 μm, and more preferably not less than 0.08 μm.

By making the adjacent concavo-convex height differences H uneven within the aforementioned predetermined range, it becomes possible to improve the efficiency of extracting light from the light output surface 10U and to suppress the rainbow unevenness due to reflected light. Moreover, since the adjacent concavo-convex height differences H may be made uneven with the standard deviation σ thereof falls within a predetermined range on the entire light output surface 10U, the sizes of the concave portions 113 and the flat portions 114 are not required to have excessive precision, which facilitates mass production and reduces manufacturing cost. Particularly, the lower limit for the range of the standard deviation σ of the adjacent concavo-convex height differences H has a significant meaning in the point that a brightness profile of the rainbow unevenness can be reduced to not more than 50% and that the rainbow unevenness can be made hardly recognizable by visual observation.

The upper limit for the predetermined range of the standard deviation σ is usually not more than 0.5 μm, preferably not more than 0.4 μm, and more preferably not more than 0.3 μm. If the degree of unevenness (variations) of the adjacent concavo-convex height differences H is excessively increased, there is a possibility, depending on the state of the concavo-convex structure, that a large number of flaws are generated in the production process of the surface light source device 10, and stable production is thereby hindered.

In the present embodiment, one or both of the heights of the apexes 11P of the concave portions 113 and the heights of the flat portions 114 may be made uneven so as to make the adjacent concavo-convex height differences H uneven. A description is herein given of the case where the adjacent concavo-convex height differences H are made uneven with the heights of the apexes 11P of the concave portions 113 being kept uniform while the heights of the flat portions 114 being uneven as shown in FIGS. 2 and 4. There is a level difference among the flat portions 114 when the heights of the flat portions 114 are made uneven as mentioned above. However, the level difference is small since the degree of unevenness is small. Accordingly, illustration of the level difference on the flat portion 114 is omitted in FIGS. 1 and 3.

The reason why the rainbow unevenness can be suppressed by making the adjacent concavo-convex height differences H uneven to have the standard deviation σ thereof within the predetermined range is not certain. However, the following reason is inferred according to studies conducted by the inventor.

When external light is emitted to the light output surface 10U, the light is reflected on the light output surface 10U, or the light which has entered into the inside of the surface light source device 10 is reflected on an internal layer interface, whereby reflected light is caused. When the reflected light is reflected on the light output surface 10U and when the reflected light goes out from the inside of the surface light source device 10, phenomena such as diffraction and refraction may occur on the light output surface 10U. Conventionally it has been considered that generation of the rainbow unevenness are due to the interference of the light which has caused phenomena such as the diffraction and the refraction. Contrary to this, it is considered that the surface light source device 10 of the present embodiment can reduce intensity of the interference by having the uneven adjacent concavo-convex height differences H on the light output surface 10U, whereby the problem of the rainbow unevenness can be solved.

The adjacent concavo-convex height differences H on the light output surface 10U may be obtained from measurement of the heights (cross-sectional profiles) with use of a laser microscope (VK-9700 made by Keyence corporation) at randomly chosen measurement points. Usually the cross-sectional profiles may be measured over a length of 100 μm along a predetermined measurement direction parallel to the light output surface 10U. Based on the measured cross-sectional profile, a pair of a concave portion and a convex portion which are adjacent to each other is defined as one concavo-convex unit, and a difference between a maximum value (corresponding to the top of the convex portion) and a minimum value (corresponding to the bottom of the concave portion) of the cross-sectional profile in this one concavo-convex unit is obtained. The obtained difference is defined as a adjacent concavo-convex height difference H in one concavo-convex unit. From a perspective of enhancing the precision, it is preferable to perform measurement at a plurality of points, e.g., at 15 points. Based on the adjacent concavo-convex height differences H measured in this manner, the standard deviation σ may be measured. When the places of the concaves and convexes on the light output surface 10U are known in advance, the measurement direction may be set as a direction parallel to the direction where the height difference H is the largest. When the places of the concaves and convexes is unknown, the measurement direction may be set so that the standard deviation satisfies the aforementioned requirement at least in one direction among the in-plane directions parallel to the light output surface 10U.

The adjacent concavo-convex height difference H is usually set in the range of 1 μm to 50 μm as a maximum value (Ra (max)) of center line mean roughness obtained by measuring the light output surface 10U along a variety of in-plane directions (a variety of directions in a plane parallel to the light output surface 10U).

The desirable range of the adjacent concavo-convex height difference H may be set in proportion to the thickness T of the concavo-convex structure layer 111. For example, if the concavo-convex structure layer 111 is made of a hard material which advantageously maintains the durability of the concavo-convex structure layer 111, the concavo-convex structure layer 111 having a thin thickness T is capable of providing an enhanced flexibility to the multi-layered body 110.

This facilitates the handling of the multi-layered body 110 in the manufacturing process of the surface light source device 10. Specifically, it is preferable to set a difference T-H shown in FIG. 4 to 0-30 μm, wherein the difference T-H is a difference between the adjacent concavo-convex height difference H and the thickness T of the concavo-convex structure layer 111.

The light extraction efficiency of the surface light source device 10 can be enhanced by appropriately adjusting a ratio of the area occupied by the flat portion 114 relative to the total area occupied by the flat portion 114 and the area occupied by the concave portion 113 where the concavo-convex structure layer 111 is observed from a direction perpendicular to the light output surface 10U (this ratio is hereinafter referred to as "the ratio of the flat portion"). More specifically, by setting the ratio of the flat portion to 10%-75%, a good light extraction efficiency can be achieved and an improved mechanical strength of the light output surface 10U may be obtained.

[Description of Material of Multi-Layered Body]

The light output surface structure layer 100 may be formed of a plurality of layers, but may also be formed of a single layer. From the perspective of easily manufacturing the light output surface structure layer 100 having desired properties, it is preferable that the layer 100 is formed of a plurality of layers. In the present embodiment, as shown in FIG. 1, the light output surface structure layer 100 includes the multi-layered body 110 having the concavo-convex structure layer 111 and the substrate film layer 112 in combination. This makes it possible to readily provide the light output surface structure layer 100 having a high performance.

The concavo-convex structure layer 111 and the substrate film layer 112 may be usually formed of a resin composition containing a transparent resin. As used herein, the expression that the transparent resin is "transparent" means that the resin has a level of light transmittance that is suitable for use as an optical member. In the present embodiment, each layer which constitutes the light output surface structure layer 100 may have a light transmittance which is suitable for use as an optical member, and the light output surface structure layer 100 in its entirety may have a total light transmittance of not less than 80%.

The transparent resin that is the content of the resin composition is not particularly limited and may be of a variety of types of the resins that can form a transparent layer. Examples of the resin may include a thermoplastic resin, a thermosetting resin, a UV curable resin, and an electron-beam curable resin. Of these types of resins, the thermoplastic resin can be easily deformed with heat and the UV curable resin has a high curability and high efficiency. Therefore, these resins are preferred because therewith the concavo-convex structure layer 111 can be efficiently formed.

Examples of the thermoplastic resin may include a polyester-based resin, a polyacrylate-based resin, and a cycloolefin polymer-based resin. Furthermore, examples of the UV curable resin may include an epoxy-based resin, an acrylic-based resin, a urethane-based resin, an ene-thiol-based resin, and an isocyanate-based resin. As these resins, those having a plurality of polymerizable functional groups may be preferably employed. As the resin, one species thereof may be solely used, or two or more species thereof may be used in combination at any ratio.

Of the aforementioned resins, preferable material for the concavo-convex structure layer 111 constituting the multi-layered body 110 are those having a high hardness when cured, from the perspective of easily forming the concavo-convex structure of the light output surface 10U and providing the concavo-convex structure with resistance to abrasion. More specifically, the material may preferably have a pencil hardness of HB or greater, more preferably H or greater, and still more preferably 2H or greater, when formed on a substrate as a resin layer having a thickness of 7 μm with no concavo-convex structure. On the other hand, preferable materials for the substrate film layer 112 are those having a certain extent of flexibility so as to facilitate the handling thereof upon formation of the concavo-convex structure layer 111 and the handling of the multi-layered body 110 after the formation of the multi-layered body 110. A combination of these materials can provide the multi-layered body 110 that can be handled easily and has outstanding durability, and as a result, makes it possible to readily manufacture a high-performance surface light source device 10.

Such a combination of materials may be provided by appropriately selecting the transparent resins among those enumerated above as the resins which constitute the respective materials. More specifically, it is preferable to employ a UV curable resin such as acrylate as the transparent resin that constitutes the material for the concavo-convex structure layer 111, while employing an alicyclic olefin polymer film (for example, ZEONOR film, which will be described later) or polyester film as the transparent resin that constitutes the material for the substrate film layer 112.

As in the present embodiment, when the light output surface structure layer 100 includes the concavo-convex structure layer 111 and the substrate film layer 112, the concavo-convex structure layer 111 and the substrate film layer 112 may be configured so that the refractive indices thereof are as close as possible. In this case, the difference in refractive index between the concavo-convex structure layer 111 and the substrate film layer 112 is preferably within 0.1, and more preferably within 0.05.

The material to be used for the layers which serve as a component of the light output surface structure layer 100 such as the concavo-convex structure layer 111 and the substrate film layer 112 may be a material having an optical diffusivity. This makes it possible to diffuse light passing through the light output surface structure layer 100, thereby further reducing changes in color tone depending on viewing angles.

Examples of the material having optical diffusivity may include materials containing particles and an alloy resin which contains two or more types of resins mixed together so as to diffuse light. Of those materials having optical diffusivity, from the perspective of readily adjusting the optical diffusiveness, materials containing particles are preferable. In particular, a resin composition containing particles is preferable.

The particles may or may not be transparent. Examples of the material of the particles may include metal, a metal compound, and a resin. Examples of the metal compound may include a metal oxide and a metal nitride. Specific examples of the metal and the metal compound may include a highly reflective metal such as silver or aluminum; and a metal compound such as silicon dioxide, aluminum oxide, zirconium oxide, silicon nitride, tin-doped indium oxide, and titanium oxide. On the other hand, examples of the resin may include a methacrylic resin, a polyurethane resin, and a silicone resin. As the material of particles, one species thereof may be solely used, or two or more species thereof may be used in combination at any ratio.

The shape of particles may be, for example, a spherical shape, a cylindrical shape, a cubic shape, a rectangular shape, a pyramid shape, a conical shape, and a star shape.

The particle diameter of particles may be preferably not less than 0.1 μm, and preferably not more than 10 μm and more preferably not more than 5 μm. As used herein, the particle diameter is defined as the 50% particle diameter in a cumulative distribution which is obtained by adding up the amount of particles measured by volume along the horizontal axis representative of the particle diameter. The greater the particle diameter is, the greater the containing ratio of the particles necessary to obtain the desired effect is. The smaller the particle diameter is, the smaller the necessary containing ratio is. Accordingly, smaller particle diameter results in obtaining desired effects such as reductions in change in color tone depending on viewing angles and an improvement in light extraction efficiency with a smaller amount of particles. For a particle having a shape other than a spherical one, the particle diameter of the particle is defined as the diameter of the sphere that has the same volume as that of the particle.

When particles are transparent and contained in a transparent resin, the difference in refractive index between the particle and the transparent resin is preferably 0.05 to 0.5, and more preferably 0.07 to 0.5. Either one of the refractive index of the particle and the refractive index of the transparent resin may be greater than the other. If the refractive index between the particle and the transparent resin is too close, a diffusion effect would not possibly be acquired, which would make it difficult to suppress the uneven color tone, whereas if a difference in the refractive index is too large, a degree of diffusion would possibly be enlarged so that, although the uneven color tone is suppressed, the light extraction effect is reduced.

The containing ratio of particles in volume ratio relative to the total volume of the layer that includes the particles is preferably not less than 1% and more preferably not less than 5%, and preferably not more than 80% and more preferably not more than 50%. By setting the containing ratio of particles to not less than the lower limit, desired effects such as reductions in change in color tone depending on viewing angles can be achieved. Furthermore, by setting the containing ratio of particles to not more than the upper limit, aggregation of particles can be prevented and stable dispersion of the particles can be achieved.

Furthermore, in necessary, the resin composition may contain an optional component. Examples of the optional component may include additives such as deterioration inhibitors such as phenol-based or amine-based deterioration inhibitors, antistatic agents such as surface active agent based or siloxane based antistatic agents, and light resistant agents such as triazole-based or 2-hydroxy-benzophenone-based light resistant agents.

The thickness T of the concavo-convex structure layer 111 is preferably, although not particularly limited thereto, 1 μm to 70 μm. In the present embodiment, the thickness T of the concavo-convex structure layer 111 is defined as the distance between the surface thereof on the substrate film layer 112 side on which no concavo-convex structure is formed, and the flat portion 114 of the concavo-convex structure.

The thickness of the substrate film layer 112 is preferably 20 μm to 30 μm.

[Supporting Substrate]

The surface light source device 10 of the present embodiment includes the supporting substrate 131 between the organic EL element 140 and the multi-layered body 110. The provision of the supporting substrate 131 can give rigidity for suppressing deflection to the surface light source device 10. The supporting substrate 131 to be provided may be a substrate having an outstanding capability of sealing the organic EL element 140 and a capability of allowing sequential formation thereon of the layers which constitute the organic EL element 140 in the manufacturing process. This makes it possible to improve durability of the surface light source device 10 and to facilitate the manufacturing process.

Examples of the material to be employed for forming the supporting substrate 131 may include glass and resin. As the material for the supporting substrate 131, one species may be solely used, or two or more species may also be used in combination at any ratio.

The refractive index of the supporting substrate 131 is preferably 1.4 to 2.0, although not particularly limited thereto.

The thickness of the supporting substrate 131 is preferably 0.1 mm to 5 mm, although not particularly limited thereto.

[Adhesive Layer]

The surface light source device 10 of the present embodiment includes an adhesive layer 121 between the multi-layered body 110 and the supporting substrate 131. The adhesive layer 121 is interposed between the substrate film layer 112 of the multi-layered body 110 and the supporting substrate 131 in order to bond these two layers together.

The adhesive, i.e., the material for the adhesive layer 121 may include not only an adhesive in a strict sense (with a shear storage elastic modulus of 1 to 500 MPa at 23° C., showing no adhesion at room temperatures, i.e., a so-called hot-melt adhesive) but also an adhesive which has a shear storage elastic modulus of less than 1 MPa at 23° C. More specifically, the adhesive to be appropriately employed may be a material having a refractive index close to that of the supporting substrate 131 or the substrate film layer 112 and having transparency. Specific examples of the adhesive may include an acrylic-based adhesive or tackiness agent. The thickness of the adhesive layer is preferably 5 μm to 100 μm.

(Manufacturing Method)

Although not particularly limited thereto, the surface light source device 10 may be manufactured, e.g., by: forming layers that constitute the organic EL element 140 on one surface of the supporting substrate 131; and affixing, before or after the layer formation, the multi-layered body 110 having the concavo-convex structure layer 111 and the substrate film layer 112 to the other surface of the supporting substrate 131 via the adhesive layer 121.

The multi-layered body 110 having the concavo-convex structure layer 111 and the substrate film layer 112 may be manufactured, for example, by preparing a mold such as a metal mold having a desired shape, and then transferring the mold to a material layer which forms the concavo-convex structure layer 111. Examples of more specific methods may include the following:

[Method 1] Preparing an unworked multi-layered body which has a layer of a resin composition A for constituting the substrate film layer 112 and a layer of a resin composition B for constituting the concavo-convex structure layer 111 (with the concavo-convex structure not yet formed), and then forming the concavo-convex structure on the resin composition B side of the unworked multi-layered body; and

[Method 2] Applying a liquid state resin composition B onto the substrate film layer 112, putting a mold on the layer of the applied resin composition B, and then curing the resin composition B with the mold keeping in that state, to form the concave-convex structure layer 111.

In Method 1, the unworked multi-layered body may be obtained, for example, by extrusion in which the resin composition A and the resin composition B are co-extruded. The concavo-convex structure may be formed by pushing with a pressure a mold having a desired surface shape against the resin composition B side of the unworked multi-layered body.

More specifically, an elongated unworked multi-layered body is formed continuously by extrusion, and then the unworked multi-layered body is pressed with a transfer roll having a desired surface shape and a nip roll, to thereby perform continuous production in an efficient manner. The nip pressure applied by the transfer roll and the nip roll is preferably a few MPa to a few tens of MPa. The temperature at the time of transfer is preferably not less than Tg and not more than (Tg+100° C.), where Tg is the glass transition temperature of the resin composition B. The duration of contact between the unworked multi-layered body and the transfer roll may be adjusted by the feed speed of the film, i.e., the rotational speed of the roll, and is preferably not shorter than 5 seconds and not longer than 600 seconds.

In Method 2, as the resin composition B for forming the concavo-convex structure layer 111, it is preferable to use a composition which can be cured by energy radiation such as ultraviolet radiation. Such a resin composition B is applied onto the substrate film layer 112, and then a mold is put thereon. Keeping that state, the resin composition B is cured by being irradiated with energy radiation such as ultraviolet radiation from a light source located at the backside of the coated surface (that is, opposite to the surface of the substrate film layer on which the resin composition B has been coated). After that, the mold is removed, to thereby obtain the multi-layered body 110 with the coating of the resin composition B formed as the concavo-convex structure layer 111.

(Major Advantages of Surface Light Source Device)

As the surface light source device 10 of the present embodiment is configured as described above, light emitted from the light-emitting surface 144 of the organic EL element 140 passes through the light output surface structure layer 100 to be extracted from the light output surface 10U. At this time, since the light output surface 10U has the concavo-convex structure having the concave portions 113 and the flat portions 114, the light can be extracted from the light output surface 10U with higher efficiency than in the instance without the concavo-convex structure.

Since the surface light source device 10 has the light output surface 10U on which the adjacent concavo-convex height differences H are made uneven with the standard deviation σ thereof falling within a predetermined range, the rainbow unevenness due to the reflected light can be suppressed. Moreover, when the surface light source device 10 is provided in a display device, it is possible to prevent the image multiplication phenomenon. Furthermore, since the size of each of the concave portion 113 and flat portion 114 does not have to be precise, mass production is facilitated and manufacturing cost can be reduced.

Furthermore, with the surface light source device 10 of the present embodiment, chipping, etc. of the light output surface 10U due to an external impact can be prevented, whereby mechanical strength of the light output surface 10U can be improved. In general, when an impact is applied to a surface with a concavo-convex structure, part of the concavo-convex structure would tend to be subjected to intensive force and thus easily damaged. However, in the surface light source device 10 of this embodiment, the flat portions 114 are flat planes (flat surfaces). Also in the present embodiment, although the heights of the flat portions 114 are uneven, the degree of unevenness is small. It is thereby possible to prevent part of the concavo-convex structure layer 111 from being subjected to intensive force due to an external force or impact applied to the light output surface 10U. It is therefore possible to prevent breakage of the concavo-convex structure layer 111, to thereby simultaneously achieve both a good light extraction efficiency and a high mechanical strength of the light output surface 10U of the surface light source device 10.

With the surface light source device 10 of the present embodiment, it is possible to reduce changes in color tone depending on viewing angles. In the surface light source device 10, the light is diffused by the concave portions 113 for emission from the light output surface 10U. Such light diffusion can reduce at least one of alteration in x-coordinate and the y-coordinate of chromaticity coordinates of light emitted from the light output surface 10U in all the hemispherical directions, when compared with the case where the light output surface is uniformly made into a flat plane. Therefore, it is possible to suppress changes in color tone depending on viewing angles for observing the light output surface 10U.

As an example of the method for measuring such chromaticity alteration in all hemispherical directions, a spectral radiance meter may be placed along the normal direction of the light output surface 10U (i.e., a direction perpendicular to the light output surface 10U), and a mechanism capable of rotating the light output surface in the range of −90 to 90° relative to the normal direction being defined as 0° may be given thereto. With this system, the chromaticity coordinates can be calculated on the basis of the emission spectra measured in the respective directions. In this manner, the alteration thereof can be calculated.

[2. Second Embodiment]

In the surface light source device of the present invention, the shape of the concave portions and the convex portions constituting the light output surface is not limited to the pyramidal shape shown in the first embodiment, but may also be a prismoidal shape. The "prismoidal shape" herein refers to a shape obtained by chamfering the apex of a pyramid to form a flat portion thereon. An example thereof will be described hereinbelow with reference to the drawings.

Figure 5:
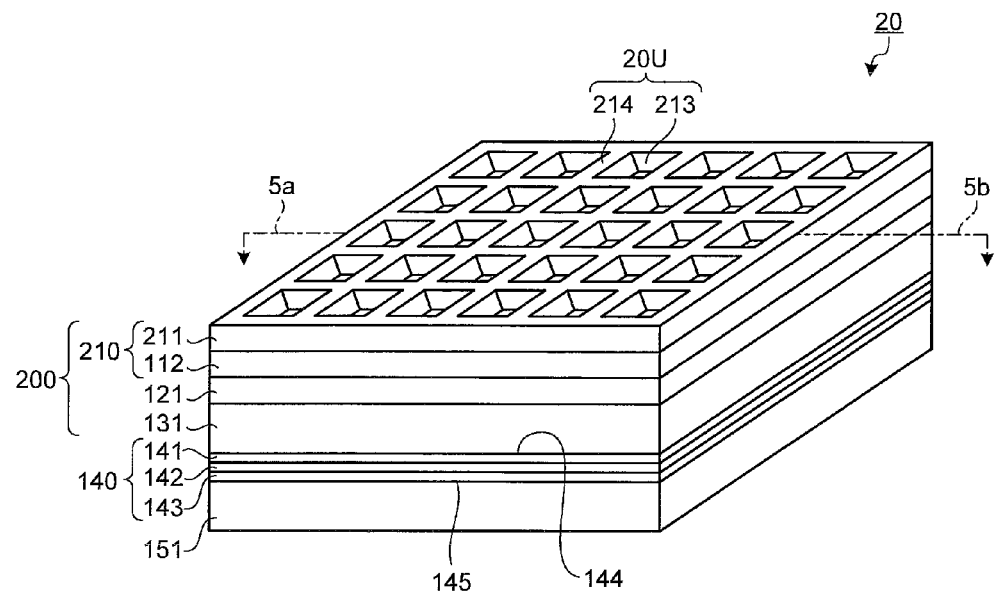
FIG. 5 is a perspective view schematically illustrating a surface light source device according to a second embodiment of the present invention.
Figure 6:
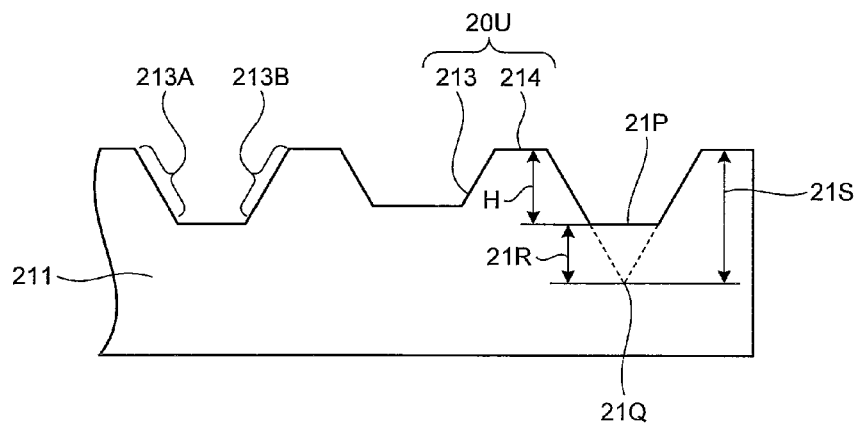
FIG. 6 is a cross-sectional view schematically illustrating the surface light source device according to the second embodiment of the present invention, the cross section thereof cutting the concavo-convex structure layer of the surface light source device shown in FIG. 5 along a plane passing through line 5a-5b and perpendicular to a light output surface.

FIGS. 5 and 6 are explanatory views illustrating a surface light source device according to a second embodiment of the present invention. FIG. 5 is a perspective view schematically illustrating the surface light source device. FIG. 6 is a schematic cross-sectional view illustrating a concavo-convex structure layer of the surface light source device of FIG. 5 wherein the layer is cut by a plane passing through line 5a-5b and perpendicular to a light output surface.

As shown in FIG. 5, the surface light source device 20 according to the second embodiment has the same structure as that of the first embodiment except that, in a multi-layered body 210 constituting a light output surface structure layer 200, a concave portion 213 formed on a light output surface 20U that is a surface of a concavo-convex structure layer 211 has a different shape.

As shown in FIG. 6, the concave portion 213 formed on the surface of the concavo-convex structure layer 211 has a shape obtained by flatly chamfering the apex of a regular quadrangular pyramid (prismoidal shape). The concave portions 213 are provided on the light output surface 20U at regular intervals. A gap is provided between adjacent concave portions 213, and the gap constitutes a flat portion 214. Further, since the concave portion 213 has a prismoidal shape, the concave portion 213 has a bottom surface portion 21P at the bottom thereof as a flat surface parallel to the light output surface 20U.

Also in the present embodiment, the adjacent concavo-convex height differences H on the light output surface 20U are made uneven so that the standard deviation σ thereof falls within a predetermined range. In the present embodiment, the bottom surface portion 21P is the bottom of the concave portion 213, while the flat portion 214 is the top of the convex portion. Accordingly, in the surface light source device 20, when the concave portions 213 and the flat portions 214 which are adjacent to each other are compared, the distances H in the thickness direction of the surface light source device 20 between the bottom surface portions 21P and the flat portions 214 (i.e., the adjacent concavo-convex height difference) are made uneven so that the standard deviation σ thereof falls within a predetermined range. As shown in FIG. 6, in the example illustrated by the present embodiment, the heights of the flat portions 214 are uniformly leveled while the heights of the bottom surface portions 21P are unevenly leveled so that the adjacent concavo-convex height differences H are made uneven. However, the unevenness of the adjacent concavo-convex height differences H may be made by unevenly leveling the heights of the flat portions 214 whereas the heights of the bottom surface portions 21P are uniformly leveled. The unevenness of the adjacent concavo-convex height differences H may also be made by unevenly leveling both the heights of the bottom surface portions 21P and the heights of the flat portions 214.

When the surface light source device has such a light output surface 20U including the concave portions 213 having a prismoidal shape and the flat portions 214 which are gaps between the concave portions, it is also possible to enhance the light extraction efficiency and to suppress the rainbow unevenness as in the case of the first embodiment. Moreover, dust and chips accumulated in the concave portion 213 would possibly cause, for example, degradation in light extraction efficiency and occurrence of bright spots. However, when the bottom of the concave portion 213 is formed as the flat bottom surface portion 21P, accumulation of dust and chips in the concave portion 213 is preferably avoided. Furthermore, according to the present embodiment, the same advantages as those obtained in the first embodiment can also be obtained.

When the concave portion 213 is formed in a prismoidal shape as in the present embodiment, a height difference 21R between the bottom surface portion 21P and an apex 21Q, which would be obtained when the apex of the prismoid would not be flattened but pointed to be in a pyramidal shape, may usually be not more than 20% of a height 21S of the pyramid that would be obtained when the apex of the prismoid would not be flattened but pointed to be in the pyramidal shape.

When the concave portion 213 is formed in a prismoidal shape, the angle between the inclined surfaces 212A and 213B excluding the bottom surface portion 21P is considered as the angle of the inclined surface. The light extraction efficiency can be enhanced by setting the angle of the inclined surface of the concave portion 213 in this manner. It is not necessary that all the inclined surfaces have the same angle. Some inclined surfaces may have a different angle within the aforementioned range.

[3. Third Embodiment]

In the surface light source device of the present invention, the bottom of the concave portion forming the light output surface may be in a round shape. An example thereof will be described hereinbelow with reference to the drawings.

Figure 7:
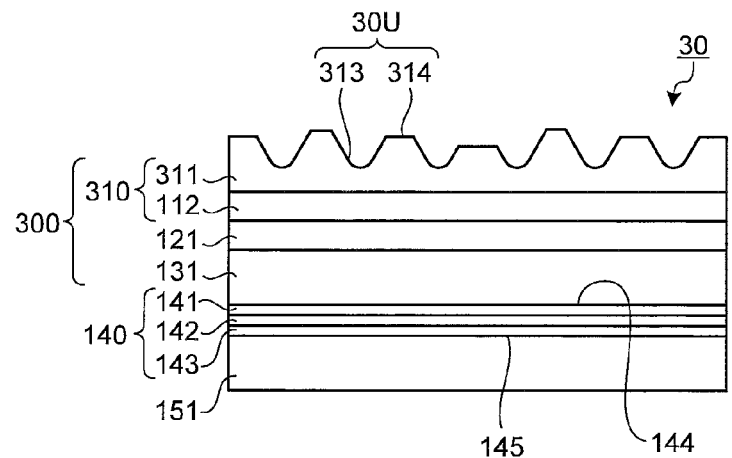
FIG. 7 is a cross-sectional view schematically illustrating a cross section of the surface light source device according to a third embodiment of the present invention, the cross section being along a plane perpendicular to a light output surface.
Figure 8:
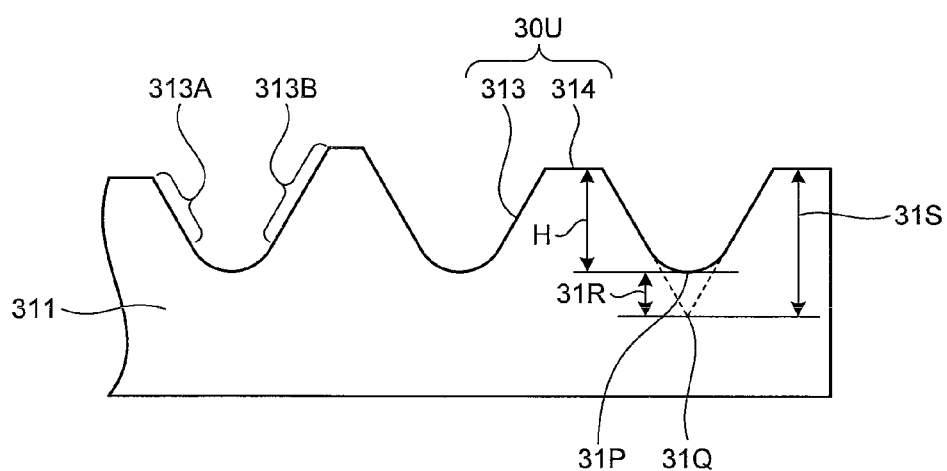
FIG. 8 is a cross-sectional view schematically illustrating the concavo-convex structure layer of the surface light source device according to the third embodiment of the present invention, the cross section thereof being along a plane perpendicular to the light output surface.

FIGS. 7 and 8 are explanatory views illustrating a surface light source device according to a third embodiment of the present invention. FIG. 7 is a cross-sectional view schematically illustrating the surface light source device, wherein the device is cut by a plane perpendicular to a light output surface. FIG. 8 is a cross-sectional view schematically illustrating a concavo-convex structure layer of the surface light source device, wherein the layer is cut by a plane perpendicular to the light output surface.

As shown in FIG. 7, the surface light source device 30 according to the third embodiment has the same structure as that of the first embodiment except that, in a multi-layered body 310 constituting a light output surface structure layer 300, a concave portion 313 formed on a light output surface 30U that is the surface of a concavo-convex structure layer 311 has a different shape.

As shown in FIG. 8, the concave portion 313 formed on the surface of the concavo-convex structure layer 311 has shape with a round bottom 31P. The concave portions 313 are provided on the light output surface 30U at regular intervals. A gap is provided between adjacent concave portions 313, and the gap constitutes a flat portion 314.

Also in the present embodiment, the adjacent concavo-convex height differences H on the light output surface 30U are made uneven so that the standard deviation σ thereof falls within a predetermined range. In the present embodiment, the flat portion 314 is the top of the convex portion. Accordingly, in the surface light source device 30, when the concave portions 313 and the flat portions 314 which are adjacent to each other are compared, the distances H in the thickness direction of the surface light source device 30 between the bottoms 31P of the concave portions 313 and the flat portions 314 (i.e., the adjacent concavo-convex height differences) are made uneven so that the standard deviation σ thereof falls within a predetermined range. As shown in FIGS. 7 and 8, in the example illustrated by the present embodiment, the heights of the bottoms 31P of the concave portions 313 are uniformly leveled while the heights of the flat portions 314 are unevenly leveled so that the adjacent concavo-convex height differences H are made uneven. However, the unevenness of the adjacent concavo-convex height differences H may be made by unevenly leveling the heights of the bottoms 31P of the concave portions 313 whereas the heights of the flat portions 314 are uniformly leveled. The unevenness of the adjacent concavo-convex height differences H may also be made by unevenly leveling both the heights of the bottoms 31P of the concave portions 313 and the heights of the flat portions 314.

When the surface light source device has such a light output surface 30U including the concave portions 313 having the round bottom 31P and the flat portions 314 which are gaps between the concave portions, it is also possible to enhance the light extraction efficiency and to suppress the rainbow unevenness as in the case of the first embodiment. Moreover, dust and chips accumulated in the concave portion 313 would possibly cause, for example, degradation in light extraction efficiency and occurrence of bright spots. However, when the bottom 31P of the concave portion 313 is formed in a round shape, accumulation of dust and chips in the concave portion 313 is preferably avoided. Furthermore, according to the present embodiment, the same advantages as those obtained in the first embodiment can also be obtained.

When the bottom 31P of the concave portion 313 is formed in a round shape as in the present embodiment, a height difference 31R between the bottom 31P and an apex 31Q, which would be obtained when the bottom would not be rounded but pointed to be in a pyramidal shape, may usually be not more than 20% of a height 31S of the pyramid that would be obtained when the bottom would not be rounded but pointed to be in the pyramidal shape.

When the bottom of the concave portion 313 is in a round shape, the angle between the inclined surfaces 313A and 313B excluding the round portion is defined as the angle of the inclined surface. The light extraction efficiency can be enhanced by setting the angle of the inclined surface in this manner. It is not necessary that all the inclined surfaces have the same angle. Some inclined surfaces may have a different angle within the aforementioned range.

[4. Fourth Embodiment]

In the first to third embodiments, the concavo-convex structure of the light output surface are created by providing the concave portions on the light output surface. However, the concavo-convex structure of the light output surface may also be created by providing convex portions on the light output surface. An example thereof will be described hereinbelow with reference to the drawings.

Figure 9:
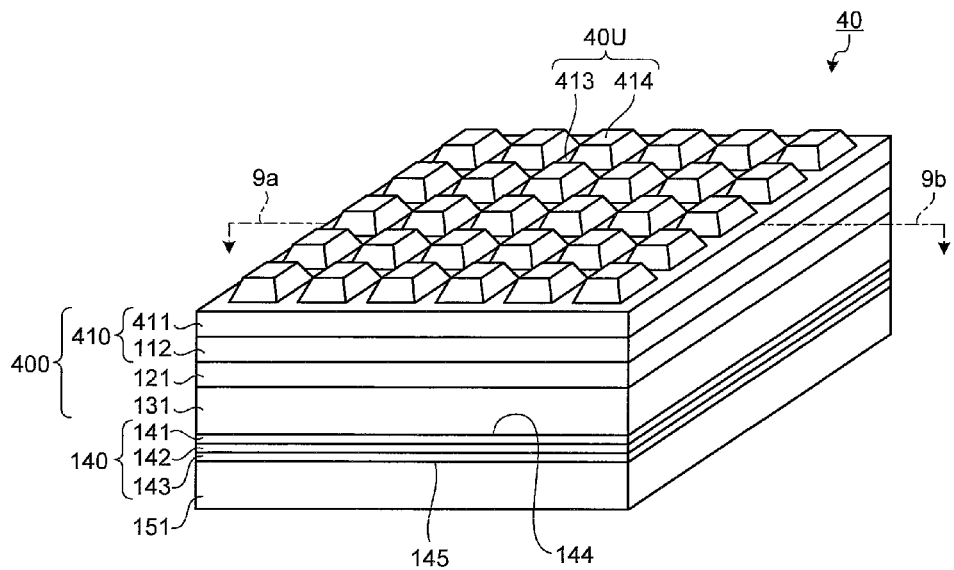
FIG. 9 is a perspective view schematically illustrating a surface light source device according to a fourth embodiment of the present invention.
Figure 10:
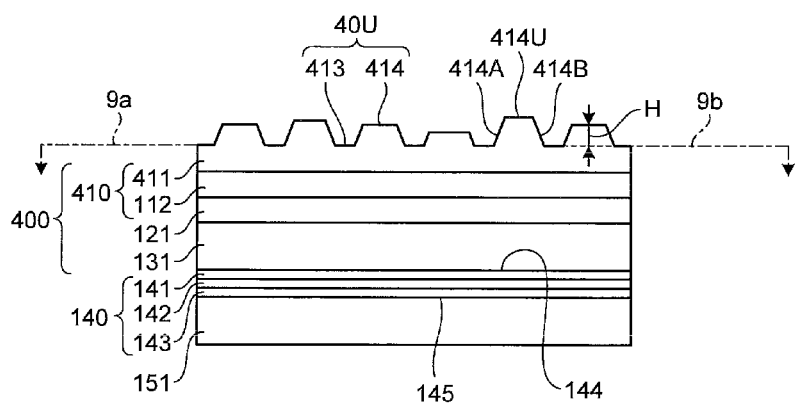
FIG. 10 is a cross-sectional view illustrating the surface light source device according to the fourth embodiment of the present invention, the cross section thereof cutting the surface light source device shown in FIG. 9 along a plane passing through line 9a-9b and perpendicular to a light output surface.

FIGS. 9 and 10 are explanatory views illustrating a surface light source device according to a fourth embodiment of the present invention. FIG. 9 is a perspective view schematically illustrating the surface light source device. FIG. 10 is a schematic cross-sectional view illustrating the surface light source device of FIG. 9 wherein the device is cut by a plane passing through line 9a-9b and perpendicular to a light output surface.

As shown in FIG. 9, the surface light source device 40 according to the fourth embodiment has the same structure as that of the first embodiment except that, in a multi-layered body 410 constituting a light output surface structure layer 400, a convex portion 414 is provided in place of the concave portion 113 on a light output surface 40U that is the surface of a concavo-convex structure layer 411.

The convex portions 414 are provided at regular intervals on the light output surface 40U. A gap is provided between adjacent convex portions 414, and the gap constitutes a flat portion 413. In this case, the convex portion 414 acts as the convex portion of the present invention since the convex portion 414 is projected relatively to the flat portion 413, while the flat portion 413 acts as the concave portion of the present invention since the flat portion 413 is recessed relatively to the convex portion 414. The concavo-convex structure defines the light output surface 40U.

Each of the convex portions 414 is formed in a shape obtained by chamfering the apex of a regular quadrangular pyramid to form a flat portion thereon (prismoidal shape). Therefore, as shown in FIG. 10, the convex portion 414 includes four inclined surfaces 414A and 414B, and an upper surface portion 414U surrounded by the inclined surfaces 414A and 414B. The upper surface portion 414U, which is the upper base face of the prismoid of the convex portion 414, is a flat plane. The flat portion 413 is also a flat plane. Each of the flat portion 413 and the upper surface portion 414U is parallel to the light output surface 40U and the light-emitting surface 144.

Also in the present embodiment, the adjacent concavo-convex height differences H on the light output surface 40U are made uneven so that the standard deviation σ thereof falls within a predetermined range. In the present embodiment, the flat portion 413 is the bottom of the concave portion, while the upper surface portion 414U is the top of the convex portion 414. Accordingly, in the surface light source device 40, when the flat portions 413 and the convex portions 414 which are adjacent to each other are compared, the distances H in the thickness direction of the surface light source device 40 between the flat portions 413 and the upper surface portions 414U (i.e., the adjacent concavo-convex height differences) are made uneven so that the standard deviation σ thereof falls within a predetermined range. As shown in FIG. 10, in the example illustrated by the present embodiment, the heights of the flat portions 413 are uniformly leveled while the heights of the upper surface portions 414U are unevenly leveled so that the adjacent concavo-convex height differences H are made uneven. However, the unevenness of the adjacent concavo-convex height differences H may be made by unevenly leveling the heights of the flat portions 413 whereas the heights of the upper surface portions 414U are uniformly leveled. The unevenness of the adjacent concavo-convex height differences H may also be made by unevenly leveling both the heights of the flat portions 413 and the heights of the upper surface portions 414U.

When the light output surface 40U has such a concavo-convex structure with the convex portions 414 provided thereon, it is also possible to enhance the light extraction efficiency and to suppress the rainbow unevenness as in the case of the first embodiment. Moreover, since the upper surface portion 414U which is the top of the convex portion 414 is a flat plane, chipping, etc. of the light output surface 40U can be prevented, whereby mechanical strength of the light output surface 40U can be improved. Furthermore, according to the present embodiment, the same advantages as those obtained in the first embodiment can also be obtained.

[5. Fifth Embodiment]

In the surface light source device of the present invention, the concave portions and the convex portions constituting a light output surface may be formed in a shape other than the aforementioned pyramidal and prismoidal shapes, and may be in, e.g., a partially spherical shape.

Moreover, the concave portions and the convex portions are arranged on the light output surface in a manner other than those exemplified in the first to fourth embodiments wherein arrangement is made along two in-plane directions which are perpendicular to each other. In addition to these configurations, the concave portions and the convex portions may also be arranged in an arbitrary manner. For example, a plurality of the concave portions may be arranged on the light output surface only in one in-plane direction or along three or more in-plane directions, or they may be placed at random.

An example thereof will be described hereinbelow with reference to the drawings.

Figure 11:
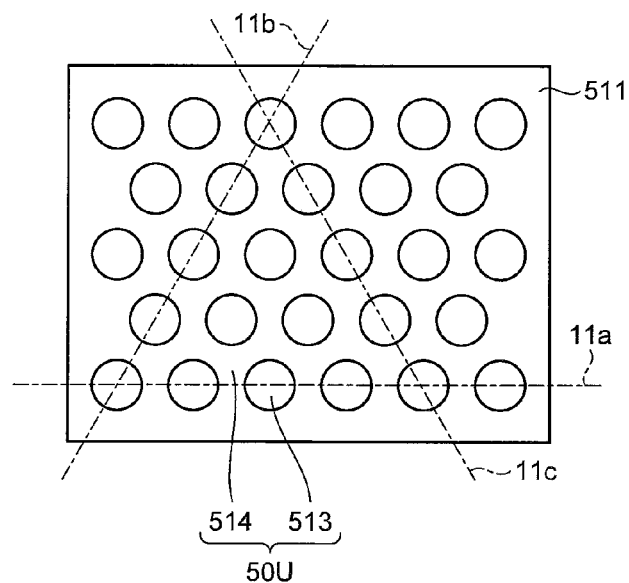
FIG. 11 is a top view schematically illustrating the surface light source device according to a fifth embodiment of the present invention when viewed in the thickness direction of the surface light source device.
Figure 12:
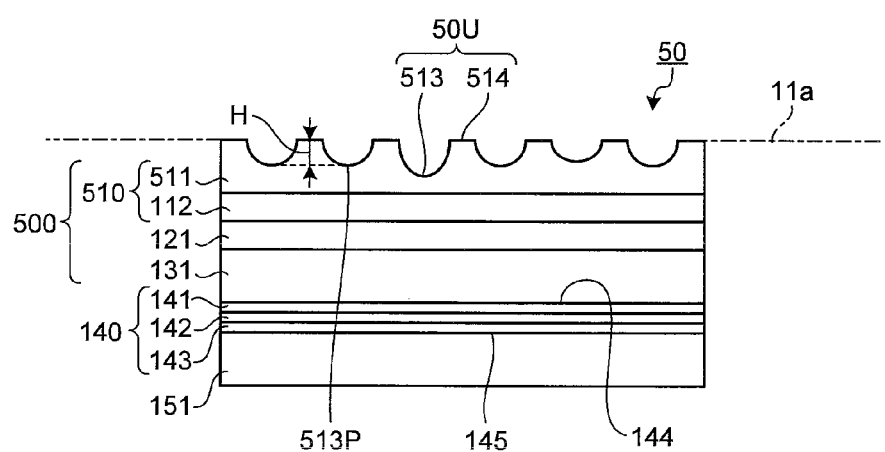
FIG. 12 is a cross-sectional view illustrating the surface light source device according to the fifth embodiment of the present invention, the cross section thereof cutting the surface light source device shown in FIG. 11 along a plane passing through line 11a in FIG. 11 and perpendicular to a light output surface.

FIGS. 11 and 12 are explanatory views illustrating a surface light source device according to a fifth embodiment of the present invention. FIG. 11 is a top view schematically illustrating the surface light source device as viewed in the thickness direction. FIG. 12 is a cross-sectional view illustrating the surface light source device shown in FIG. 11, wherein the device is cut by a plane passing through line 11a of FIG. 11 and perpendicular to a light output surface 50U.

As shown in FIGS. 11 and 12, the surface light source device 50 according to the fifth embodiment has the same structure as that of the first embodiment except that, in a multi-layered body 510 constituting a light output surface structure layer 500, the light output surface 50U that is the surface of a concavo-convex structure layer 511 has a different shape.

A concave portion 513 formed on the surface of the concavo-convex structure layer 511 has a hemispherical shape. On the light output surface 50U, the concave portions 513 are consecutively arranged at regular intervals along three in-plane directions that are parallel to lines 11a, 11b, and 11c, respectively. The lines 11a, 11b, and 11c form an angle of 60° with each other. A gap is provided between adjacent concave portions 513 along the lines 11a, 11b, and 11c, and the gap constitutes a flat portion 514.

Also in the present embodiment, the adjacent concavo-convex height differences H on the light output surface 50U are made uneven so that the standard deviation σ thereof falls within a predetermined range. In the present embodiment, the flat portion 514 is the top of the convex portion. Accordingly, in the surface light source device 50, when the concave portions 513 and the flat portions 514 which are adjacent to each other are compared, the distances H in the thickness direction of the surface light source device 50 between bottoms 513P of the concave portions 513 and the flat portions 514 (i.e., the adjacent concavo-convex height differences) are made uneven so that the standard deviation σ thereof falls within a predetermined range. As shown in FIG. 12, in the example illustrated by the present embodiment, the heights of the flat portions 514 are uniformly leveled while the heights of the bottoms 513P of the concave portions 513 are unevenly leveled so that the adjacent concavo-convex height differences H are made uneven. However, the unevenness of the adjacent concavo-convex height differences H may be made by unevenly leveling the heights of the flat portions 514 whereas the heights of the bottoms 513P of the concave portions 513 are uniformly leveled. The unevenness of the adjacent concavo-convex height differences H may also be made by unevenly leveling both the heights of the bottoms 513P of the concave portions 513 and the heights of the flat portions 514.

When the surface light source device has such a light output surface 50U including the concave portions 513 having a partially spherical shape and the flat portions 514 which are gaps between the concave portions, it is also possible to enhance the light extraction efficiency and to suppress the rainbow unevenness as in the case of the first embodiment. Moreover, when the concave portion 513 has a partially spherical shape, the bottom of the concave portion 513 becomes round. Accordingly, accumulation of dust and chips in the concave portion 513 is preferably avoided. Furthermore, the same advantages as those obtained in the first embodiment can also be obtained.

[6. Sixth Embodiment]

In the surface light source device of the present invention, the top of the convex portions constituting a light output surface may be in a round shape. An example thereof will be described hereinbelow with reference to the drawing.

Figure 13:
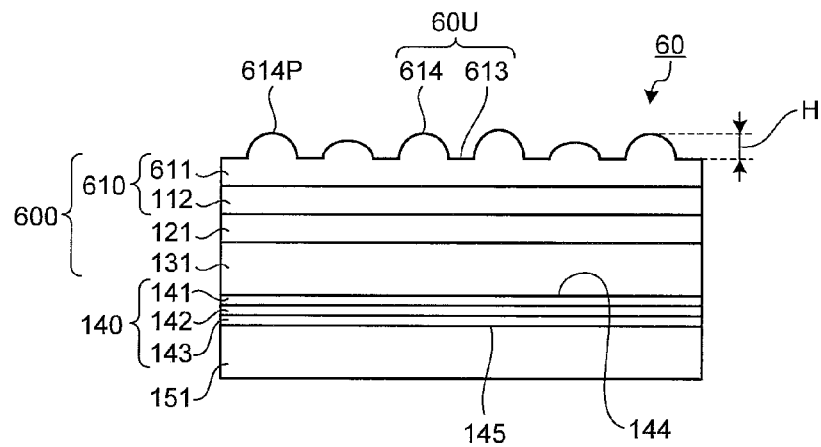
FIG. 13 is a cross-sectional view illustrating the surface light source device according to a sixth embodiment of the present invention, the cross section thereof being along a plane perpendicular to a light output surface.

FIG. 13 is a cross-sectional view illustrating a surface light source device according to a sixth embodiment of the present invention, wherein the device is cut by a plane perpendicular to the light output surface.

As shown in FIG. 13, the surface light source device 60 according to the sixth embodiment has the same structure as that of the fifth embodiment except that, in a multi-layered body 610 constituting a light output surface structure layer 600, a hemispherical convex portion 614 is provided in place of the hemispherical concave portion 513 on a light output surface 60U that is the surface of a concavo-convex structure layer 611.

The convex portions 614 are provided at regular intervals on the light output surface 60U. A gap is provided between adjacent convex portions 614, and the gap constitutes a flat portion 613. In this case, the convex portion 614 acts as the convex portion of the present invention since the convex portion 614 is projected relatively to the flat portion 613, while the flat portion 613 acts as the concave portion of the present invention since the flat portion 613 is recessed relatively to the convex portion 614. The concavo-convex structure defines the light output surface 60U.

Also in the present embodiment, the adjacent concavo-convex height differences H on the light output surface 60U are made uneven so that the standard deviation σ thereof falls within a predetermined range. In the present embodiment, the flat portion 613 is the bottom of the concave portion. Accordingly, in the surface light source device 60, when the flat portions 613 and the convex portions 614 which are adjacent to each other are compared, the distances H in the thickness direction of the surface light source device 60 between the flat portions 613 and tops 614P of the convex portions 614 (i.e., the adjacent concavo-convex height differences) are made uneven so that the standard deviation σ falls within a predetermined range. As shown in FIG. 13, in the example illustrated by the present embodiment, the heights of the flat portions 613 are uniformly leveled while the heights of the tops 614P of the convex portions 614 are unevenly leveled so that the adjacent concavo-convex height differences H are made uneven. However, the unevenness of the adjacent concavo-convex height differences H may be made by unevenly leveling the heights of the flat portions 613 whereas the heights of the tops 614P of the convex portions 614 are uniformly leveled. The unevenness of the adjacent concavo-convex height differences H may also be made by unevenly leveling both the heights of the flat portions 613 and the heights of the tops 614P of the convex portions 614.

When the surface light source device has such a light output surface 60U including the convex portions 614 having a partially spherical shape and the flat portions 613 which are gaps between the convex portions, it is also possible to enhance the light extraction efficiency and to suppress the rainbow unevenness as in the case of the first embodiment. Moreover, when the convex portion 614 has a partially spherical shape, the top 614P of the convex portion 614 becomes round. This makes it possible to prevent foreign materials from being caught by the convex portion 614 to damage the light output surface 60U. Furthermore, the same advantages as those obtained in the first embodiment can also be obtained.

[7. Seventh Embodiment]

In the surface light source device of the present invention, the concave portions and the convex portions constituting a light output surface may be formed in a groove shape. An example thereof will be described hereinbelow with reference to the drawing.

Figure 14:
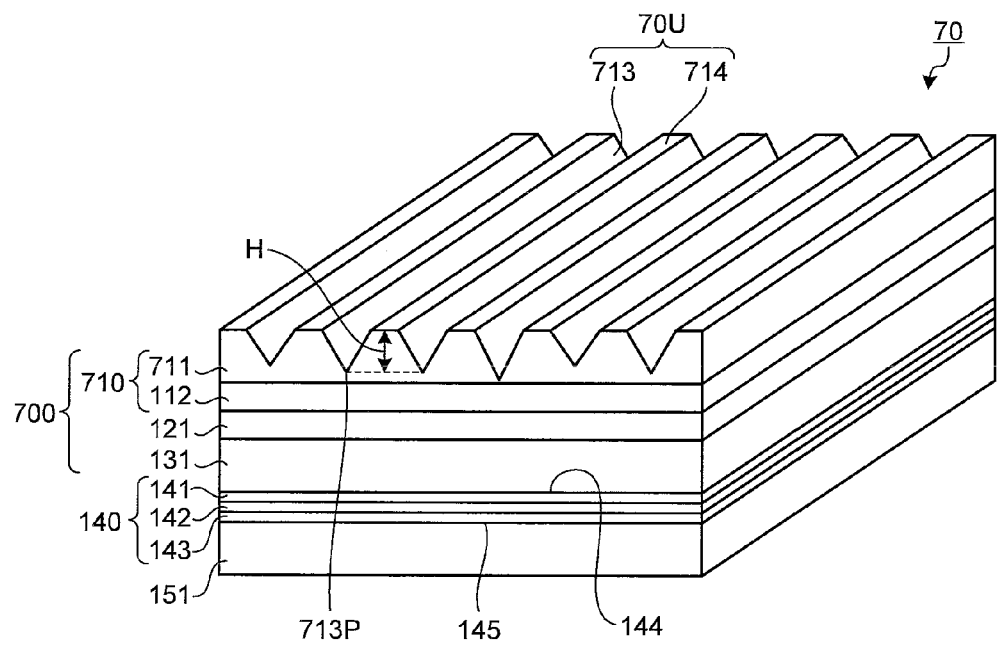
FIG. 14 is a perspective view schematically illustrating a surface light source device according to a seventh embodiment of the present invention.

FIG. 14 is a perspective view schematically illustrating a surface light source device according to a seventh embodiment of the present invention. As shown in FIG. 14, the surface light source device 70 according to the seventh embodiment has the same structure as that of the first embodiment except that, in a multi-layered body 710 constituting a light output surface structure layer 700, a light output surface 70U that is the surface of a concavo-convex structure layer 711 has a different shape.

Each of a plurality of concave portions 713 formed on the surface of the concavo-convex structure layer 711 has a linear groove shape which has two flat inclined surfaces. Accordingly, the cross section of the concave portion 713 along a plane perpendicular to an extending direction of the groove has a triangular shape having two oblique sides.

A plurality of the concave portions 713 are arranged in parallel on the light output surface 70U. Therefore, a gap is provided between adjacent concave portions 713. The gap constitutes a flat portion 714 on the light output surface 70U. That is, the concave portion 713 and the flat portion 714 exist in an alternate manner at least in an in-plane direction perpendicular to the extending direction of the groove among the in-plane directions parallel to the light output surface 70U.

Also in the present embodiment, the adjacent concavo-convex height differences H on the light output surface 70U are made uneven so that the standard deviation σ thereof falls within a predetermined range. In the present embodiment, the flat portion 714 is the top of the convex portion. Therefore, in the surface light source device 70, when the concave portion 713 and the flat portion 714 which are adjacent to each other at least in the in-plane direction perpendicular to the extending direction of the groove are compared, the distances H in the thickness direction of the surface light source device 70 between the bottoms 713P of the concave portions 713 and the flat portions 714 (i.e., the adjacent concavo-convex height differences) are made uneven so that the standard deviation σ thereof falls within a predetermined range. As shown in FIG.

14, in the example illustrated by the present embodiment, the heights of the flat portions 714 are uniformly leveled while the heights of the bottoms 713P of the concave portions 713 are unevenly leveled so that the adjacent concavo-convex height differences H are made uneven. However, the unevenness of the adjacent concavo-convex height differences H may be made by unevenly leveling the heights of the flat portions 714 whereas the heights of the bottoms 713P of the concave portions 713 are uniformly leveled. The unevenness of the adjacent concavo-convex height differences H may also be made by unevenly leveling both the heights of the bottoms 713P of the concave portions 713 and the heights of the flat portions 714.

When the surface light source device has such a light output surface 70U including the concave portions 713 having a groove shape, it is also possible to enhance the light extraction efficiency and to suppress the rainbow unevenness as in the case of the first embodiment. Furthermore, the same advantages as those obtained in the first embodiment can also be obtained.

The groove shaped concave portion 713 may take a variety of shapes without being limited to the triangular cross-sectional shape as illustrated above. For example, the cross section of the groove may be in other polygonal shapes such as pentagonal and heptagonal shapes, or may be in a shape other than polygonal shapes such as a partially spherical shape. Furthermore, the cross-sectional groove shape may be deformed in a shape with a rounded apex or a shape with the apex chamfered to be flat.

[8. Eighth Embodiment]

In the aforementioned first to seventh embodiments, when the concave portions or the convex portions are arranged on the light output surface along two or more in-plane directions, the flat portion is structured as a gap provided between the concave portions or between the convex portions which are adjacent to each other in all of these two or more in-plane directions. However, the present invention is not limited thereto, and the gap may be provided in a part of these two or more in-plane directions. An example thereof will be described hereinbelow with reference to the drawings.

Figure 15:
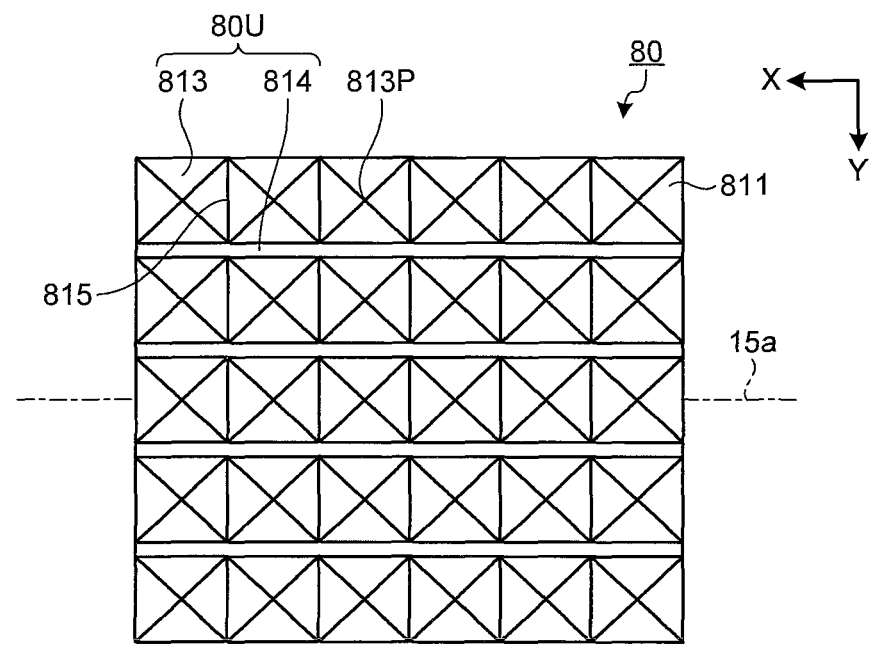
FIG. 15 is a top view schematically illustrating the surface light source device according to an eighth embodiment of the present invention when viewed in the thickness direction of the surface light source device.
Figure 16:
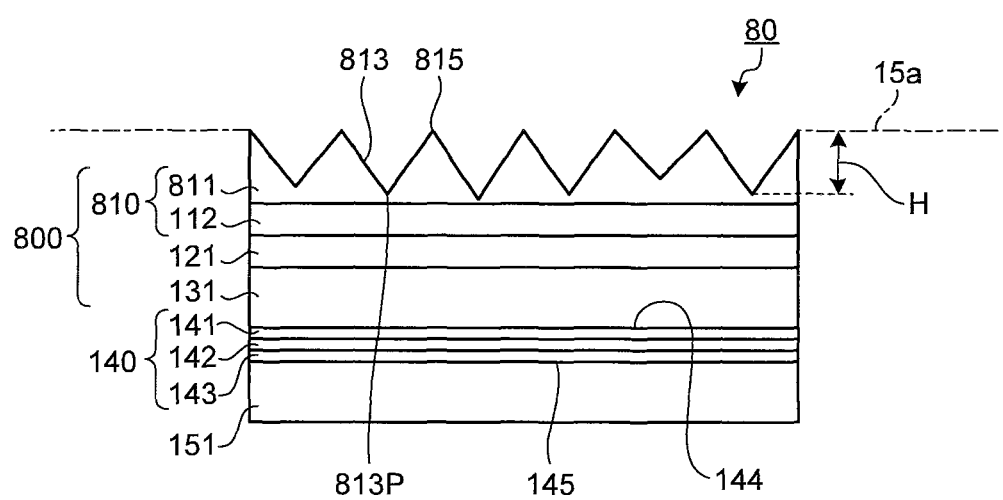
FIG. 16 is a cross-sectional view illustrating the surface light source device according to the eighth embodiment of the present invention, the cross section thereof cutting the surface light source device shown in FIG. 15 along a plane passing through line 15a in FIG. 15 and perpendicular to a light output surface.

FIGS. 15 and 16 are explanatory views illustrating a surface light source device according to an eighth embodiment of the present invention. FIG. 15 is a top view schematically illustrating the surface light source device as viewed in the thickness direction. FIG. 16 is a cross-sectional view illustrating the surface light source device shown in FIG. 15, wherein the device is cut by a plane passing through line 15a of FIG. 15 and perpendicular to a light output surface 80U. As shown in FIGS. 15 and 16, the surface light source device 80 according to the eighth embodiment has the same structure as that of the first embodiment except that, in a multi-layered body 810 constituting a light output surface structure layer 800, the light output surface 80U that is the surface of a concavo-convex structure layer 811 has a different shape.

Each of a plurality of concave portions 813 formed on the surface of the concavo-convex structure layer 811 is in a quadrangular pyramid shape that is the same as the shape of the concave portions 113 in the first embodiment. However, a gap between the concave portions 813 is provided only between the concave portions 813 which are adjacent to each other in an in-plane direction Y perpendicular to the line 15a of FIG. 15. As a result, a flat portion 814 extending in an in-plane direction X parallel to the line 15a is structured.

Also in the present embodiment, the adjacent concavo-convex height differences H on the light output surface 80U are made uneven at least in the in-plane direction Y so that the standard deviation σ thereof falls within a predetermined range. In the present embodiment, the flat portion 814 is the top of the convex portion. A boundary part 815 between the mutually adjacent concave portions 813 in the in-plane direction X also acts as the top of the convex portion. Accordingly, in the surface light source device 80, when the mutually adjacent concave portions 813 and flat portions 814 in the in-plane direction Y are compared, or when the mutually adjacent concave portions 813 in the in-plane direction X and the boundary parts 815 are compared, the distances H in the thickness direction of the surface light source device 80 between bottoms 813P of the concave portions 813 and the flat portions 814 (i.e., the adjacent concavo-convex height differences), or the distances H in the thickness direction of the surface light source device 80 between the bottoms 813P of the concave portions 813 and the boundary parts 815 (i.e., the adjacent concavo-convex height differences) are made uneven so that the standard deviation σ thereof falls within a predetermined range. As shown in FIG. 16, in the example illustrated by the present embodiment, the heights of the flat portions 814 and the boundary parts 815 are uniformly leveled while the heights of the bottoms 813P of the concave portions 813 are unevenly leveled so that the adjacent concavo-convex height differences H are made uneven. However, the unevenness of the adjacent concavo-convex height differences H may be made by unevenly leveling the heights of the flat portions 814 and the boundary parts 815 whereas the heights of the bottoms 813P of the concave portions 813 are uniformly leveled. The unevenness of the adjacent concavo-convex height differences H may also be made by unevenly leveling all of the heights of the bottoms 813P of the concave portions 813, the heights of the flat portions 814, and the heights of the boundary parts 815.

When the surface light source device has such a light output surface 80U which includes the flat portions 814 only in a part of directions among the aforementioned two or more in-plane directions, it is also possible to enhance the light extraction efficiency and to suppress the rainbow unevenness as in the case of the first embodiment. Furthermore, the same advantages as those obtained in the first embodiment can also be obtained. As compared with the case of the first embodiment, the light output surface of the present embodiment may have relatively poor resistance to the abrasion when the light output surface receives abrasion along a certain direction (e.g., the in-plane direction X parallel to an extending direction of the flat portion 814). However, since the light extraction efficiency thereof may be improved, the present embodiment may be preferably used in some cases.

As to the shape of the concave portion 813 in the present embodiment, the height of the boundary part 815 between adjacent concave portions 813 is the same as the height of the flat portion 814. However, the height of the boundary part 815 may be made different from the height of the flat portion 814.

Figure 17:
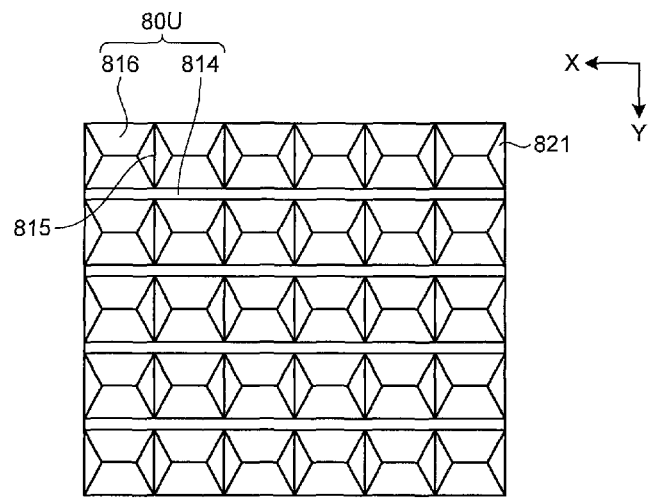
FIG. 17 is a top view schematically illustrating a modification of the concavo-convex structure layer according to the eighth embodiment when viewed in the thickness direction thereof.

Furthermore, although a description has been given of an example in which the concave portion 813 is in the shape of a quadrangular pyramid only, the concave portion 813 may take other shapes. For example, as shown in FIG. 17, a plurality of hip roof-shaped concave portions 816 may be arranged. The concavo-convex structure layer 821 shown in FIG. 17 is a modification of the concavo-convex structure layer 811 of the eighth embodiment, and therefore has the same structure as the concavo-convex structure layer 811 of the eighth embodiment except that the concave portion has a different shape.

[9. Ninth Embodiment]

In the aforementioned first to eighth embodiments, descriptions have been made by taking as examples the surface light source devices of a single-sided emission type which use only one side of the surface light source device as a light output surface. However, the surface light source device of the present invention may be a surface light source device of a double-side light emission type which uses both sides of the surface light source device as a light-emitting surface. An example thereof will be described hereinbelow with reference to the drawing.

Figure 18:
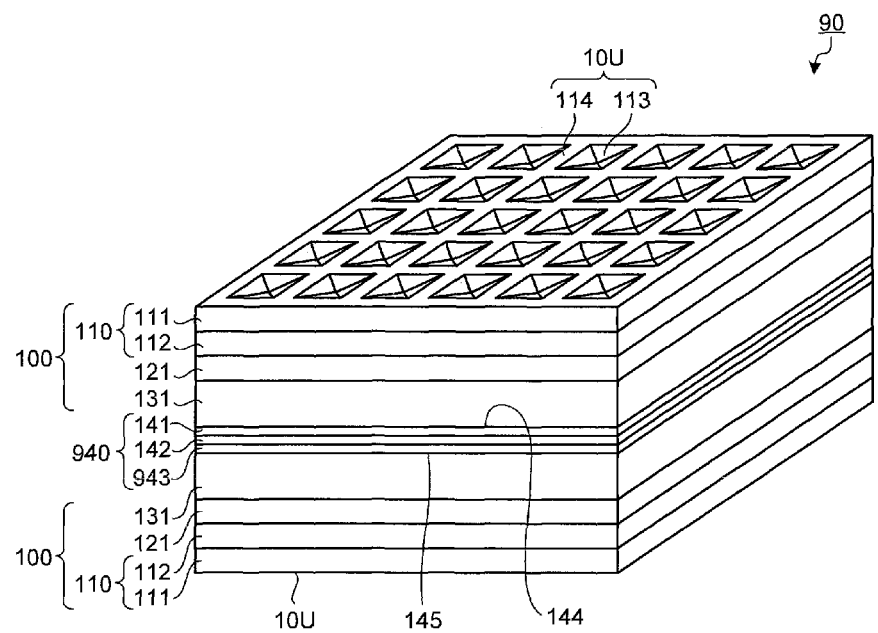
FIG. 18 is a perspective view schematically illustrating a surface light source device according to a ninth embodiment of the present invention.

FIG. 18 is a perspective view schematically illustrating a surface light source device according to a ninth embodiment of the present invention.

As shown in FIG. 18, the surface light source device 90 according to the ninth embodiment has the same structure as that of the first embodiment except that an organic EL element 940 includes a second electrode layer 943 that is a transparent electrode in place of the second electrode layer 143 that is a reflecting electrode and that a light output surface structure layer 100 is provided in place of the sealing substrate 151. Between the light output surface structure layer 100 located on the lower side in the drawing and the second electrode layer 943, there may exist any substance such as a filler or an adhesive or may exist a gap. In the gap, there may exist air or other gases so long as no disadvantage is caused, for example, unless the durability of the light-emitting layer 142 is not seriously compromised. Alternatively, the gap may be in vacuo.

Since the second electrode layer 943 is a transparent electrode, light from the light-emitting layer 142 passes through the first electrode layer 141 and the second electrode layer 943, and goes out from both light output surfaces 10U located on the upper side and the lower side of the drawing. Accordingly, the surface 145 of the organic EL element 940 located on the lower side in the drawing also functions as a light-emitting surface. When light thus goes out from both the front surface and the back surface, it is also possible to enhance the light extraction efficiency and to suppress the rainbow unevenness as in the case of the first embodiment.

In the surface light source device 90 of the present embodiment, the light which was incident onto one light output surface 10U usually passes through the surface light source device 90 and exits from the other light output surface 10U. It is thus possible for viewer's naked eye to see through the surface light source device 90 to thereby implement a see-through type surface light source device. As a result, diversified designs can be realized. Furthermore, the same advantages as those obtained in the first embodiment can also be obtained.

[10. Other Embodiments]

While the embodiments of the present invention have been described above, the present invention is not limited to the aforementioned embodiments, and the embodiments may further be modified for implementation.

For example, in the aforementioned embodiments, the light output surface structure layer was directly provided in contact with the light-emitting surface. However, the light output surface structure layer may be provided on the light-emitting surface via another optional layer. Examples of the optional layers may include a gas barrier layer for protecting the organic EL element from outside air and moisture, and a ultraviolet cut layer for blocking ultraviolet rays.

Moreover, for example, the aforementioned embodiments shown are those having the light output surface structure layer that consists of a concavo-convex structure layer, a substrate film layer, an adhesive layer, and a supporting substrate. However, the light output surface structure layer may consist of layers that are fewer than these, or may otherwise include optional layers in addition to these layers. For example, the concavo-convex structure layer may also have a coating layer on a surface thereof, so that the coating layer defines the concavo-convex structure of the light output surface.

The shapes of the concave portion and the convex portion are not limited to those exemplified in the aforementioned embodiments. The concave portion and the convex portion may be, for example, in a pyramidal shape such as a triangular pyramid, a pentagonal pyramid, a hexagonal pyramid and a quadrangular pyramid whose bottom face is not square.

Moreover, the aforementioned embodiments shown are, e.g., those wherein the concave portions and the convex portions of the identical shape are distributed over the entire light output surface. However, the light output surface may include a mixture of concave portions and convex portions having different shapes. Specific examples thereof may include a mixture of pyramidal concave portions different in size, a mixture of pyramidal concave portions and conic concave portions, and a mixture of concave portions in the shape of a combination of a plurality of pyramids and concave portions in a simple pyramidal shape. Furthermore, both the concave portions and the convex portions may coexist on the same light output surface. For example, the concave portion 113 of the first embodiment and the convex portion 414 of the fourth embodiment may coexist in combination.

Moreover, the aforementioned embodiments shown are, e.g., those wherein the widths of the concave portions and the convex portions and the interval between adjacent concave portions and the interval between adjacent convex portions are constant. However, concave portions and convex portions having small widths and large widths may coexist. Portions having wide intervals and portions having narrow intervals between adjacent concave portions and between adjacent convex portions may coexist.

Moreover, for example, as to those including a reflecting electrode among the aforementioned embodiments, the reflecting electrode may be replaced with a combination of a transparent electrode and a reflecting layer, whereby a device having the same effect as those having the reflecting electrode may be structured.

Furthermore, in the ninth embodiment, the example shown has the same light output surface structure layer 100 on both the light-emitting surfaces 144 and 145 of the organic EL element 940. However, a combination of different light output surface structure layers may be provided on the light-emitting surface 144 and the light-emitting surface 145. Furthermore, in the surface light source device of a double-side light emission type, if at least one light-emitting surface has a light output surface structure layer, the other light-emitting surface does not have to have another light output surface structure layer.

[11. Lighting Apparatus and Backlight Unit]

The surface light source device of the present invention may be used for applications such as a lighting apparatus and a backlight unit.

The lighting apparatus includes the surface light source device of the present invention as a light source, and if necessary, further includes an optional component such as a member for holding the light source and a circuit for supplying power.

The backlight unit includes the surface light source device of the present invention as a light source, and if necessary, further includes an optional component such as an enclosure, a circuit for supplying electrical power, and a diffusion plate, diffusion sheet, and prism sheet for making the output light more uniform. Possible applications of the backlight unit may include a backlight of a display device that displays an image by controlling pixels, such as a liquid crystal display, and a backlight of a display device that displays a fixed image such as a signboard.

EXAMPLES

The present invention will be specifically explained referring to Examples. However, the present invention is not limited to Examples shown below, but may be arbitrary modified without departing from the scope of the claims and equivalents thereof. In the following descriptions, the refractive index of a resin will indicate the refractive index of the resin after cured.

Example 1

(1-1: Manufacture of Multi-Layered Body A)

A substrate film (ZEONOR film made by ZEON Corporation, thickness of 100 μm, refractive index n=1.53) was coated with a UV (ultraviolet) curable resin (urethane acrylate resin, refractive index n=1.54). Then, a metal mold with a predetermined shape was brought into pressure contact with the top of the resin coating, and irradiation with ultraviolet light onto the substrate film side in the accumulated light amount of 1000 mJ/cm$^2$ was performed, to form a concavo-convex structure layer b (thickness of 15 μm) on the substrate film. Thus, a multi-layered body A was obtained as a rectangular film having a layer structure of (the substrate film a)-(the concavo-convex structure layer b).

Figure 19:
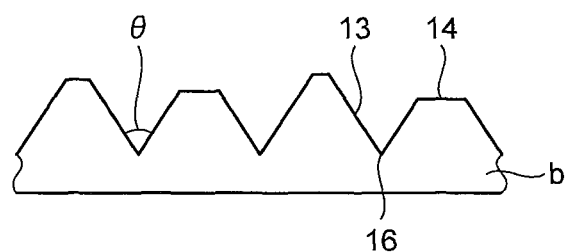
FIG. 19 is a cross-sectional view schematically illustrating a cross section of a concavo-convex structure layer b manufactured in Example 1, the cross section being along a plane perpendicular to a principal plane thereof.

A cross-sectional view of the concavo-convex structure layer b manufactured in Example 1 is schematically shown in FIG. 19, wherein the cross section is along a plane perpendicular to a principal plane thereof. As shown in FIG. 19, in the multi-layered body A, the concavo-convex structure on the concavo-convex structure layer b was composed of a plurality of quadrangular pyramid-shaped concave portions 13 and flat portions 14 positioned around the concave portions 13. The cross-sectional structure of the concavo-convex structure layer b wherein the cross section is along a plane perpendicular to the principal plane thereof was as follows. The apex angle θ of the concave portion 13 was 60°. The heights of apexes 16 of the quadrangular pyramids of the concave portions 13 were uniform, while the heights of the flat portions 14 were randomly uneven.

(1-2: Measurement of Height and Variations)

Measurement points on the surface of the concavo-convex structure layer b were randomly chosen, and the height (cross-sectional profiles) were measured with a laser microscope (VK-9700 made by Keyence corporation). Since the concave portions in the concavo-convex structure layer b were placed along two perpendicular in-plane directions, one of these in-plane directions was employed as a measurement direction, and the cross-sectional profiles were measured along this measurement direction. In the measured cross-sectional profile, a pair of mutually adjacent concave portion and convex portion was defined as one concavo-convex unit, and the difference between the maximum value and the minimum value of the cross-sectional profile in this one concavo-convex unit was defined as the adjacent concavo-convex height difference H in one concavo-convex unit. The aforementioned measurement was performed over a length of 100 μm at every measurement point. In the fixed measurement direction, the same measurement was performed at 15 measurement points in total. From the measurement values thus obtained, the mean value and the standard deviation σ of the adjacent concavo-convex height differences H on the surface of the concavo-convex structure layer b were calculated. As a result, the mean value was 24.3 μm and the standard deviation σ was 0.12 μm. The base edge size of a quadrangular pyramid of the concave portion 13 was 11.5 μm, the depth of the concave portion 13 was 10 μm, and the width size of the flat portion 14 was 4 μm.

(1-3: Measurement of Rainbow Unevenness)

The multi-layered body A was bonded to a glass substrate via an adhesive (acrylic-based resin, refractive index of 1.49, CS9621 made by NITTO DENKO CORP.) to obtain a glass substrate-attached multi-layered body B.

A light shielding plate having a 5-mm wide slit was placed immediately before a fluorescent light to prepare a light source.

Figure 20:
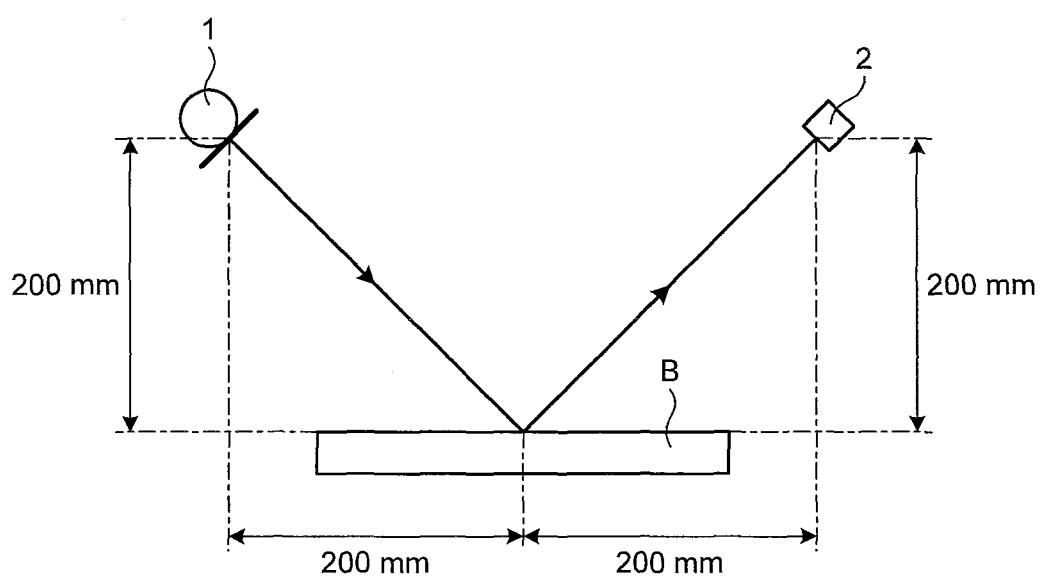
FIG. 20 is a view schematically illustrating measurement of rainbow unevenness performed in Example 1.

FIG. 20 schematically illustrates measurement of rainbow unevenness. As shown in FIG. 20, the glass substrate-attached multi-layered body B was placed in a darkroom with the concavo-convex surface thereof being oriented vertically upward and being horizontal. The light source 1 was placed at a position which was distanced by 200 mm in the horizontal direction and raised by 200 mm in the vertical direction from the glass substrate-attached multi-layered body B. Further, a position which was distanced by 200 mm in the horizontal direction opposite to the light source and raised by 200 mm in the vertical direction, from the glass substrate-attached multi-layered body B, was set as an observation point, at which a camera 2 was placed.

The glass substrate-attached multi-layered body B was irradiated with a parallel light beam from the light source 1, and reflected light obtained by the reflection of the parallel light beam on the concavo-convex surface was shot by the camera 2 at the observation point. In the shot image, a reflected image of the light source and a plurality of rainbow unevenness were observed as an image of bands extending approximately parallel to each other.

A brightness profile of the shot image was measured with an image analysis software (analySIS made by Soft Imaging System gmbh). The brightness peak value (P1) in the image of the reflected light source and the brightness peak value (P2) in the rainbow unevenness adjacent thereto were extracted, and brightness attenuation was expressed on percentage based on the following formula. Rainbow unevenness images may appear on both sides of the image of the reflected light source. In that case, the image with a higher brightness peak value is employed.

Brightness attenuation ratio (%)=$P2/P1 \times 100$

A larger value of the brightness attenuation ratio indicates a larger rainbow unevenness, whereas a smaller value indicates a smaller rainbow unevenness. When the value is not less than 50%, the rainbow unevenness can clearly be recognized by visual observation.

In the present embodiment, the brightness attenuation ratio was 37.9%.

(2-1: Manufacture of Transparent Organic EL Element)

On one main surface of a 0.7 mm thick glass substrate, a transparent electrode layer of 100 nm, a hole transport layer of 10 nm, a yellow light-emitting layer of 20 nm, a blue light-emitting layer of 15 nm, an electron transport layer of 15 nm, an electron injection layer of 1 nm, and a reflecting electrode layer of 100 nm were formed in this order. The layers from the hole transport layer to the electron transport layer were all formed with organic materials. The yellow light-emitting layer and the blue light-emitting layer have an emission spectrum different from each other.

The materials for forming the respective layers from the transparent electrode layer to the reflecting electrode layer were as following.

Transparent electrode layer; tin-doped indium oxide (ITO)
Hole transport layer; 4,4'-bis[N-(naphthyl)-N-phenylamino]biphenyl (α-NPD)
Yellow light-emitting layer; 1.5 wt % rubrene-doped α-NPD
Blue light-emitting layer; 10 wt % iridium complex-doped 4,4'-dicarbazolyl-1,1'-biphenyl (CBP)
Electron transport layer; phenanthroline derivative (BCP)
Electron injection layer; lithium fluoride (LiF)
Reflecting electrode layer; Al The transparent electrode layer was formed by reactive sputtering with an ITO target, and with a surface electrical resistance of not more than 10Ω/square. The layers from the hole injection layer to the reflecting electrode layer were formed by placing in a vacuum vapor-deposition system the glass substrate having the transparent electrode layer formed thereon, and then the materials for the layers from the hole transport layer to the reflecting electrode layer were sequentially vapor-deposited by resistance heating. The pressure in the system was $5\times10^{-3}$ Pa and evaporation speed was set to 0.1 to 0.2 nm/s.

Further, a wiring for applying electricity was attached to the electrode layers, and the layers from the hole transport layer to the reflective electrode layer were sealed by a sealing member. Thus, an organic EL element was obtained. The organic EL element thus obtained had a rectangular light-emitting surface capable of emitting white light from the glass substrate side.

(2-2: Manufacture of Surface Light Source Device)

The multi-layered body A obtained in the step (1-1) was bonded to the glass substrate side surface of the organic EL element obtained in the step (2-1) via an adhesive (acrylic-based resin, refractive-index of 1.49, CS9621 made by NITTO DENKO CORP.) to obtain a surface light source device including the layer structure of (the multi-layered body A)-(the adhesive layer)-(the glass substrate)-(the organic EL element). The thickness of the adhesive layer was 20 μm.

(2-3: Visual Evaluation of Rainbow Unevenness in Surface Light Source Device)

A reflected image on the surface was visually observed from the observation point in the same manner as in the step (1-3) with the surface light source device obtained in the step (2-2) being unlit. As a result, almost no rainbow unevenness were observed.

Comparative Example 1

A multi-layered body A was manufactured in the same manner as in Example 1 except that the shape of the metal mold for manufacturing the multi-layered body A was changed in the step (1-1). In the resulting multi-layered body A, the concavo-convex structure on the concavo-convex structure layer b was approximately the same as that of Example 1 although the mean value of the adjacent concavo-convex height differences H on the surface of the concavo-convex structure layer b (with a thickness of 15 μm) was 24.3 μm, and the standard deviation σ thereof was 0.03 μm. The base edge size of a quadrangular pyramid of the concave portion 13 was 11.5 μm, the depth of the concave portion 13 was 10 μm, and the width size of the flat portion 14 was 4 μm.

The rainbow unevenness was evaluated in the same manner as in the step (1-3). As a result, the brightness attenuation ratio was 87.6%.

Furthermore, a surface light source device was manufactured in the same manner as in the step (2-2) and observation was performed in the same manner as in the step (2-3). As a result, occurrence of rainbow unevenness was observed.

Example 2

A multi-layered body A was manufactured and a surface light source device was then manufactured in the same manner as in Example 1 except that the shape of the metal mold for manufacturing the multi-layered body A was changed in the step (1-1).

Figure 21:
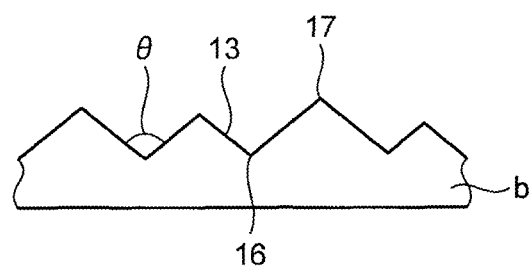
FIG. 21 is a cross-sectional view schematically illustrating a cross section of a concavo-convex structure layer b manufactured in Example 2, the cross section being along a plane perpendicular to a principal plane thereof.

A cross-sectional view of the concavo-convex structure layer b manufactured in Example 2 is schematically shown in FIG. 21, wherein the cross section is along a plane perpendicular to a principal plane thereof. As shown in FIG. 21, in the resulting multi-layered body A, the concavo-convex structure on the concavo-convex structure layer b was composed of a plurality of quadrangular pyramid-shaped concave portions 13. The cross-sectional structure of the concavo-convex structure layer b wherein the cross section is along a plane perpendicular to the principal plane thereof was as follows. The apex angle θ of the concave portion 13 was 90°. The heights of apexes 16 of the quadrangular pyramids of the concave portions 13 and the heights of apexes 17 of the convex portions were both randomly uneven.

The heights and variations of concave portions and convex portions were measured. As a result, the mean value of the adjacent concavo-convex height differences H on the surface of the concavo-convex structure layer b (with a thickness of 25 μm) was 25.6 μm, and the standard deviation σ thereof was 0.26 μm. The base edge size of a quadrangular pyramid of the concave portion 13 was 24 μm and the depth of the concave portion 13 was 20 μm.

The rainbow unevenness was evaluated in the same manner as in the step (1-3). As a result, the brightness attenuation ratio was 34.1%.

Furthermore, the surface light source device was observed in the same manner as in the step (2-3). As a result, the observed surface light source device was in a good condition with rainbow unevenness further less than those in Example 1.

Example 3

A multi-layered body A was manufactured and a surface light source device was then manufactured in the same manner as in Example 1 except that the shape of the metal mold for manufacturing the multi-layered body A was changed in the step (1-1).

Figure 22:
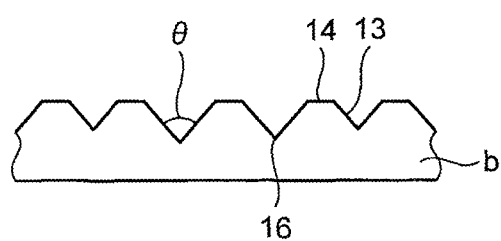
FIG. 22 is a cross-sectional view schematically illustrating a cross section of a concavo-convex structure layer b manufactured in Example 3, the cross section being along a plane perpendicular to a principal plane thereof.

A cross-sectional view of the concavo-convex structure layer b manufactured in Example 3 is schematically shown in FIG. 22, wherein the cross section is along a plane perpendicular to a principal plane thereof. As shown in FIG. 22, in the resulting multi-layered body A, the concavo-convex structure on the concavo-convex structure layer b was composed of a plurality of quadrangular pyramid-shaped concave portions 13 and flat portions 14 positioned around the concave portions 13. The cross-sectional structure of the concavo-convex structure layer b wherein the cross section is along a plane perpendicular to the principal plane thereof was as follows. The apex angle θ of the concave portion 13 was 60°. The heights of the quadrangular pyramids of the concave portions 13 were randomly uneven while the heights of the flat portions 14 were uniform.

The heights and the variations of concave portions and convex portions were measured. As a result, the mean value of the adjacent concavo-convex height differences H on the surface of the concavo-convex structure layer b (with a thickness of 15 μm) was 12.2 μm, and the standard deviation σ thereof was 0.43 μm. The base edge size of a quadrangular pyramid of the concave portion 13 was 11.5 μm, the depth of the concave portion 13 was 10 μm, and the width size of the flat portion 14 was 4 μm.

The rainbow unevenness was evaluated in the same manner as in the step (1-3). As a result, the brightness attenuation ratio was 47.8%.

Furthermore, the surface light source device was observed in the same manner as in the step (2-3). As a result, the observed surface light source device was in a good condition with little rainbow unevenness.

Example 4

A multi-layered body A was manufactured and a surface light source device was then manufactured in the same manner as in Example 1 except that the shape of the metal mold for manufacturing the multi-layered body A was changed in the step (1-1). In the resulting multi-layered body A, the concavo-convex structure on the concavo-convex structure layer b was approximately the same as that of Example 1 although the mean value of the adjacent concavo-convex height differences H on the surface of the concavo-convex structure layer b (with a thickness of 35 μm) was 12.2 μm, and the standard deviation σ thereof was 0.06 μm. The base edge size of a quadrangular pyramid of the concave portion 13 was 34 μm, the depth of the concave portion 13 was 30 μm, and the width size of the flat portion 14 was 2 μm.

The rainbow unevenness was evaluated in the same manner as in the step (1-3). As a result, the brightness attenuation ratio was 44.0%.

Furthermore, the surface light source device was observed in the same manner as in the step (2-3). As a result, the observed surface light source device was in a good condition with little rainbow unevenness.

Example 5

(1-4: Manufacture of Multi-Layered Body B)

Particles (silicone resin) of 2 μm in diameter were added to a UV (ultraviolet light) curable resin (urethane acrylate resin, refractive index n=1.54). The mixture was stirred to disperse the particles, to prepare a resin composition (1) for use as a material of the concavo-convex structure layer b. The content of particles was set at 10 weight % of the total volume of the resin composition (1).

A substrate film (ZEONOR film made by ZEON Corporation) was coated with the resin composition (1). Then, a metal mold with a predetermined shape was brought into pressure contact with the top of the resin composition (1) coating, and irradiation with ultraviolet light onto the substrate film side in the accumulated light amount of 1000 mJ/cm² was performed, to form a concavo-convex structure layer b on the substrate film. Thus, a multi-layered body C was obtained as a rectangular film having a layer structure of (the substrate film a)-(the concavo-convex structure layer b). In the resulting multi-layered body C, the concavo-convex structure on the concavo-convex structure layer b was approximately the same as that of Example 1 although the mean value of the adjacent concavo-convex height differences H on the surface of the concavo-convex structure layer b (with a thickness of 15 μm) was 24.3 μm, and the standard deviation σ thereof was 0.12 μm. The base edge size of a quadrangular pyramid of the concave portion 13 was 11.5 μm, the depth of the concave portion 13 was 10 μm, and the width size of the flat portion 14 was 4 μm.

A surface light source device was manufactured in the same manner as in the step (2-2), to obtain a surface light source device including the layer structure of (the multi-layered body C)-(the adhesive layer)-(the glass substrate)-(the organic EL element).

The rainbow unevenness was evaluated in the same manner as in the step (1-3). As a result, the brightness attenuation ratio was 36.4%.

Furthermore, the surface light source device was observed in the same manner as in the step (2-3). As a result, the observed surface light source device was in a good condition with little rainbow unevenness.

Comparative Example 2

A multi-layered body A was manufactured in the same manner as in Example 2 except that the shape of the metal mold for manufacturing the multi-layered body A was changed in the step (1-1). In the resulting multi-layered body A, the concavo-convex structure on the concavo-convex structure layer b was approximately the same as that of Example 2 although the mean value of the adjacent concavo-convex height differences H on the surface of the concavo-convex structure layer b (with a thickness of 25 μm) was 25.6 μm, and the standard deviation σ thereof was 0.02 μm. The base edge size of a quadrangular pyramid of the concave portion 13 was 24 μm and the depth of the concave portion 13 was 20 μm.

The rainbow unevenness was evaluated in the same manner as in the step (1-3). As a result, the brightness attenuation ratio was 54.8%.

Furthermore, a surface light source device was manufactured in the same manner as in the step (2-2) and observation was performed in the same manner as in the step (2-3). As a result, occurrence of rainbow unevenness was observed.

Comparative Example 3

A multi-layered body C was manufactured in the same manner as in Example 5 except that the shape of the metal mold for manufacturing the multi-layered body B was changed in the step (1-4). In the resulting multi-layered body C, the concavo-convex structure on the concavo-convex structure layer b was approximately the same as that of Example 5 although the mean value of the adjacent concavo-convex height differences H on the surface of the concavo-convex structure layer b (with a thickness of 35 μm) was 24.3 μm, and the standard deviation σ thereof was 0.01 μm. The base edge size of a quadrangular pyramid of the concave portion 13 was 34 μm, the depth of the concave portion 13 was 30 μm, and the width size of the flat portion 14 was 2 μm.

The rainbow unevenness was evaluated in the same manner as in the step (1-3). As a result, the brightness attenuation ratio was 67.9%.

Furthermore, a surface light source device was manufactured in the same manner as in the step (2-2) and observation was performed in the same manner as in the step (2-3). As a result, occurrence of rainbow unevenness was observed.

Example 6

A multi-layered body C was manufactured in the same manner as in Comparative Example 3 except that the shape of the metal mold for manufacturing the multi-layered body B was changed in the step (1-4). In the resulting multi-layered body C, the concavo-convex structure on the concavo-convex structure layer b was approximately the same as that of Comparative Example 3 although the mean value of the adjacent concavo-convex height differences H on the surface of the concavo-convex structure layer b (with a thickness of 15 μm) was 24.3 μm, and the standard deviation σ thereof was 0.54 μm. The base edge size of a quadrangular pyramid of the concave portion 13 was 11.5 μm, the depth of the concave portion 13 was 10 μm, and the width size of the flat portion 14 was 4 μm.

The rainbow unevenness was evaluated in the same manner as in the step (1-3). As a result, the brightness attenuation ratio was 30.1%.

Furthermore, a surface light source device was manufactured in the same manner as in the step (2-2) and observation was performed in the same manner as in the step (2-3). As a result, the rainbow unevenness were in a favorable state. However, it was observed that there were a plurality of visually recognizable flaws.

[Conclusion]

The results of the foregoing Examples and Comparative Examples were summarized in Table 1 show below. In the column of visual evaluation in Table 1, the examples having almost no rainbow unevenness observed were classified as "Good" and those having occurrence of rainbow unevenness observed were classified as "Bad".

11P: Apex of the pyramid shape of the concave portion
10U: Light output surface
100: Concavo-convex structure layer
110: Multi-layered body
111: Concavo-convex structure layer
112: Substrate film layer
113: Concave portion
114: Flat portion
121: Adhesive layer
131: Supporting substrate
140: Organic EL element
141: First electrode layer
142: Light-emitting layer
143: Second electrode layer
144: Surface of the organic EL element (light-emitting surface)
145: Surface of the organic EL element
151: Sealing substrate
20: Surface light source device
20U: Light output surface
21P: Bottom surface portion
200: Light output surface structure layer
210: Multi-layered body
211: Concavo-convex structure layer

TABLE 1

[Results of Examples and Comparative Examples]

| | Convex portion | | | | | | Height | | | |
|---|---|---|---|---|---|---|---|---|---|---|
| | Apex angle of concave portion | Existence of flat portion | Height | Concave portion | | | Height diffrence H mean (μm) | difference H standard deviation σ(μm) | Brightness attenuation ratio | Visual observation |
| | | | | Height | Pitch | Particles | | | | |
| Ex. 1 | 60° | Yes | Random | Constant | Constant | No | 24.3 | 0.12 | 37.9% | Good |
| Ex. 2 | 90° | No | Random | Random | Vary | No | 25.6 | 0.26 | 34.1% | Good |
| Ex. 3 | 60° | Yes | Constant | Random | Constant | No | 12.2 | 0.43 | 47.8% | Good |
| Ex. 4 | 60° | Yes | Random | Random | Constant | No | 12.2 | 0.06 | 44.0% | Good |
| Ex. 5 | 60° | Yes | Random | Constant | Constant | 10% | 24.3 | 0.12 | 36.4% | Good |
| Comp. Ex. 1 | 60° | Yes | Constant | Constant | Constant | No | 24.3 | 0.03 | 87.6% | Bad |
| Comp. Ex. 2 | 90° | No | Constant | Constant | Constant | No | 25.6 | 0.02 | 54.8% | Bad |
| Comp. Ex. 3 | 60° | Yes | Constant | Constant | Constant | 10% | 24.3 | 0.01 | 67.9% | Bad |
| Ex. 6 | 60° | No | Constant | Constant | Constant | 10% | 24.3 | 0.54 | 30.1% | Good * |

* Example 6 was good in terms of rainbow unevenness, although existence of a plurality of visually recognizable flows were observed.

As shown in Table 1, Examples resulted in low brightness attenuation ratio and almost no rainbow unevenness observed in visual evaluation. It was thereby confirmed that the rainbow unevenness can be suppressed when the adjacent concavo-convex height differences H were made uneven so that the standard deviation σ thereof was not less than 0.05 μm. Furthermore, since flaws were observed in Example 6 which had a large standard deviation σ, it was also confirmed that there is a preferable upper limit for the range of the standard deviation σ to achieve stable production.

Industrial Applicability

The surface light source device of the present invention is suitable for use such as lighting apparatus and backlight units.

Description Of Numerals

10: Surface light source device
11A-11D: Inclined surface
11E-11H: Bottom edge of the pyramid shape of the concave portion
11J, 11K: Interval of concave portions
11L, 11M: Angle formed between the inclined surface of the concave portion and flat portion
11N: Apex angle of the pyramid shape of the concave portion
213: Concave portion
213A, 212B: Inclined surface
214: Flat portion
30: Surface light source device
30U: Light output surface
31P: Bottom
300: Light output surface structure layer
310: Multi-layered body
311: Concavo-convex structure layer
313: Concave portion
313A, 313B: Inclined surface
314: Flat portion
40: Surface light source device
40U: Light output surface
400: Light output surface structure layer
410: Multi-layered body
411: Concavo-convex structure layer
413: Flat portion
413A, 413B: Inclined surface
414: Convex portion
414U: Upper surface portion
50: Surface light source device
50U: Light output surface 500: Light output surface structure layer
510: Multi-layered body
511: Concavo-convex structure layer
513: Concave portion
514: Flat portion
60: Surface light source device
60U: Light output surface
600: Light output surface structure layer
610: Multi-layered body
611: Concavo-convex structure layer
613: Flat portion
614: Convex portion
614P: Top of convex portion
70: Surface light source device
70U: Light output surface
700: Light output surface structure layer
710: Multi-layered body
711: Concavo-convex structure layer
713: Concave portion
714: Flat portion
80: Surface light source device
80U: Light output surface
800: Light output surface structure layer
810: Multi-layered body
811: Concavo-convex structure layer
813: Concave portion
814: Flat portion
815: Boundary part of concave portions
816: Concave portion
821: Concavo-convex structure layer
90: Surface light source device
940: Organic EL element
943: Second electrode
T: Thickness of the concavo-convex structure layer
H: Adjacent concavo-convex height difference

The invention claimed is:

1. A surface light source device comprising: an organic electroluminescent element having a light-emitting surface for emitting light; and a light output surface structure layer provided on the organic electroluminescent element on a side of the light-emitting surface, wherein
the light output surface structure layer includes concave portions which are relatively recessed and convex portions which are relatively projected, the concave portions and convex portions being provided on a surface opposite to the organic electroluminescent element in an alternate manner along an in-plane direction parallel to the surface,
the depth of each concave portion is 1 to 50 μm, and
the bottom of the concave portion and the top of the convex portion that are adjacent to each other are distant with distances in a thickness direction of the surface light source device, the distances being made uneven with a standard deviation range of not less than 0.05 μm.

2. The surface light source device according to claim 1, wherein the surface of the light output surface structure layer opposite to the organic electroluminescent element is exposed on an outermost surface of the surface light source device.

3. The surface light source device according to claim 1, wherein the concave portion or the convex portion is in a pyramidal shape or a prismoidal shape.

4. The surface light source device according to claim 1, wherein the top of the convex portion is a flat surface parallel to the light-emitting surface.

5. The surface light source device according to claim 1, wherein either one or both of the bottom of the concave portion and the top of the convex portion is/are in a round shape.

* * * * *